(12) United States Patent
Nakata et al.

(10) Patent No.: US 12,733,103 B2
(45) Date of Patent: Sep. 8, 2026

(54) SEMICONDUCTOR DEVICE, POWER CONVERSION DEVICE, AND METHOD OF MANUFACTURING SEMICONDUCTOR DEVICE

(71) Applicant: Mitsubishi Electric Corporation, Tokyo (JP)

(72) Inventors: Yosuke Nakata, Tokyo (JP); Yuji Sato, Tokyo (JP); Kentaro Yoshida, Tokyo (JP); Kei Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 322 days.

(21) Appl. No.: 18/625,500

(22) Filed: Apr. 3, 2024

(65) Prior Publication Data

US 2024/0422914 A1 Dec. 19, 2024

(30) Foreign Application Priority Data

Jun. 14, 2023 (JP) ................................ 2023-097607

(51) Int. Cl.
*H02M 7/00* (2006.01)
*H02M 7/48* (2007.01)
(Continued)

(52) U.S. Cl.
CPC ............... *H05K 1/18* (2013.01); *H02P 27/06* (2013.01); *H05K 3/284* (2013.01); *H05K 3/301* (2013.01); *H05K 7/209* (2013.01); *H02M 7/003* (2013.01); *H02M 7/48* (2013.01); *H05K 2201/10015* (2013.01); *H05K 2201/10166* (2013.01);
(Continued)

(58) Field of Classification Search
CPC ................................ H02M 7/003; H02M 7/48
See application file for complete search history.

(56) References Cited

U.S. PATENT DOCUMENTS

| | | | |
|---|---|---|---|
| 6,181,590 B1 | 1/2001 | Yamane et al. | |
| 2021/0144888 A1* | 5/2021 | Sano | H02M 7/003 |
| 2022/0181980 A1* | 6/2022 | Suzuki | H02M 3/33569 |

FOREIGN PATENT DOCUMENTS

| | | |
|---|---|---|
| JP | 2000-350474 A | 12/2000 |

OTHER PUBLICATIONS

Kinya Nakatsu et al., "A Wiring Implementation Technology to Reduce the Inductance of the Power Module", Journal of The Japan Institute of Electronic Packaging, 2015, vol. 18, Issue 4, pp. 270-278.

* cited by examiner

*Primary Examiner* — Gary A Nash
(74) *Attorney, Agent, or Firm* — Studebaker Brackett PLLC

(57) ABSTRACT

Provided is a technique capable of reducing wiring inductance of a smoothing capacitor. A circuit pattern electrically connected to a semiconductor element is provided on an insulating substrate on a cooler. A smoothing capacitor is disposed not to be overlapped with the semiconductor element in a plan view to include an inner electrode forming capacitance, a capacitor case housing the inner electrode, and a terminal protruding from the capacitor case seamlessly. A first sealing portion covers at least a part of each of the terminal of the smoothing capacitor, the insulating substrate, and the circuit pattern. The terminal of the smoothing capacitor and the circuit pattern are directly connected to each other by bonding force of an interface between the terminal and the circuit pattern.

15 Claims, 19 Drawing Sheets

(51) Int. Cl.
*H02P 27/06* (2006.01)
*H05K 1/18* (2006.01)
*H05K 3/28* (2006.01)
*H05K 3/30* (2006.01)
*H05K 7/20* (2006.01)
*H10W 72/00* (2026.01)
*H10W 72/30* (2026.01)
*H10W 90/00* (2026.01)

(52) U.S. Cl.
CPC ............. *H05K 2201/10757* (2013.01); *H10W 72/07354* (2026.01); *H10W 72/347* (2026.01); *H10W 72/352* (2026.01); *H10W 72/865* (2026.01); *H10W 72/884* (2026.01); *H10W 90/736* (2026.01); *H10W 90/756* (2026.01)

202A

SEMICONDUCTOR DEVICE, POWER CONVERSION DEVICE, AND METHOD OF MANUFACTURING SEMICONDUCTOR DEVICE

BACKGROUND OF THE INVENTION

Field of the Invention

The present disclosure relates to a semiconductor device, a power conversion device, and a method of manufacturing the semiconductor device, and particularly to a semiconductor device including a smoothing capacitor, a power conversion device including the semiconductor device, and a method of manufacturing the semiconductor device.

Description of the Background Art

As described in "A Wiring Implementation Technology to Reduce the Inductance of the Power Module", Kinya Nakatsu et al., Journal of The Japan Institute of Electronic Packaging, Volume 18, Issue 4, pp. 270 to 278, 2015, an inverter which has been recently downsized is required to suppress surge voltage causing withstand voltage breakdown even when a rapid current change occurs in driving a high-speed power semiconductor. Wiring inductance of a capacitor or a power module needs to be reduced to reduce the serge voltage. Thus, "A Wiring Implementation Technology to Reduce the Inductance of the Power Module" described above discloses a wiring implementation technology of routing an internal wiring pattern in a looped form on a metal heat radiation plate of a power module, thereby efficiently guiding eddy current to the heat radiation plate, and canceling magnetic flux made by a wiring by magnetic flux of the eddy current, thereby reducing an inductance component.

According to Japanese Patent Application Laid-Open No. 2000-350474, a power module (semiconductor device) includes a switching element and a smoothing capacitor. According to Japanese Patent Application Laid-Open No. 2000-350474 described above, the smoothing capacitor is a ceramic capacitor built in the power module; thus inductance caused by the smoothing capacitor can be reduced. As a specific configuration, an insulating substrate is fixed on a base plate, a switching element (semiconductor element) is mounted on the insulating substrate, and a capacitor substrate is disposed in an upper space of the switching element. A plurality of ceramic capacitors are mounted to the capacitor substrate. Japanese Patent Application Laid-Open No. 2000-350474 also discloses, as a conventional technique, a configuration that an aluminum electrolytic capacitor as a smoothing capacitor is disposed on a lateral side of the insulating substrate described above to which a switching element is mounted. The aluminum electrolytic capacitor as the smoothing capacitor is electrically connected by using a wiring plate and a screw for fixing the wiring plate.

SUMMARY

When a capacitance of the smoothing capacitor is not sufficiently larger with respect to current handled by the semiconductor device, potential of the smoothing capacitor decreases by discharge and charge at a time of switching, and a desired output cannot be achieved. This problem is significant particular in a semiconductor device using a wide bandgap semiconductor element (for example, SiC-MOSFET), and the capacitance of the smoothing capacitor needs to have substantially several hundred μF in a case of handling large current such as driving a motor of an electrical car, for example. When the capacitance of the smoothing capacitor is large in such a case, it is difficult to house the smoothing capacitor in a space on an upper side of the semiconductor element.

In addition, a distance of wiring of a bus-bar as a wiring of the smoothing capacitor increases to locate the smoothing capacitor on the upper side of the semiconductor element also in consideration of securement of a necessary insulation distance in the semiconductor device. Furthermore, in the case of this location, it is also difficult to reduce inductance by applying the wiring implementation technology proposed in "A Wiring Implementation Technology to Reduce the Inductance of the Power Module" described above. The reason is that the bus-bar of the smoothing capacitor needs to be extended to the upper side of the semiconductor element to obtain the location described above, so that the bus-bar extends to be away from the base plate (metal heat radiation plate) supporting the semiconductor element.

In the meanwhile, in the configuration disclosed as the conventional technique in Japanese Patent Application Laid-Open No. 2000-350474, the aluminum electrolytic capacitor as the smoothing capacitor is not disposed on the upper side of the switching element but is disposed on the lateral side thereof. However, the electrical connection of the wiring plate using the screw is used, and there is a problem that inductance increases in such a connection.

The present disclosure therefore has been made to solve the above problems, and it is an object to provide a technique capable of reducing wiring inductance of a smoothing capacitor.

A semiconductor device according to the present disclosure includes: a cooler; an insulating substrate mounted on the cooler; a circuit pattern provided on the insulating substrate; a semiconductor element electrically connected to the circuit pattern; a smoothing capacitor disposed not to be overlapped with the semiconductor element in a plan view, the smoothing capacitor including an inner electrode forming capacitance, a capacitor case housing the inner electrode, and a terminal protruding from the capacitor case seamlessly; and a first sealing portion covering at least a part of each of the terminal of the smoothing capacitor, the insulating substrate, and the circuit pattern. The terminal of the smoothing capacitor and the circuit pattern are directly connected to each other by bonding force of an interface between the terminal and the circuit pattern.

According to the present disclosure, firstly, the smoothing capacitor is disposed not to be overlapped with the semiconductor element in a plan view. Accordingly, there is no limitation that the smoothing capacitor is overlapped with the semiconductor element in a plan view; thus easily applied is a wiring location capable of reducing inductance. Secondly, if a fastening member such as a screw is used in connecting the terminal of the smoothing capacitor, wiring inductance increases due to increase of length of the wiring, and it is also difficult to apply a parallel-plate wiring structure to cancel the increase of the wiring inductance. In contrast, according to the present embodiment, the terminal of the smoothing capacitor and the circuit pattern are directly connected to each other by the bonding force of the interface between the terminal and the circuit pattern. Accordingly, the capacitor case of the smoothing capacitor can be disposed near the circuit pattern. Particularly, when a joint part of the terminal of the smoothing capacitor is sealed by a sealing portion together with the circuit pattern, the smoothing capacitor can be connected with substantially a shortest distance without consideration of a creeping distance. Thus, a wiring length can be reduced; thus the wiring inductance can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
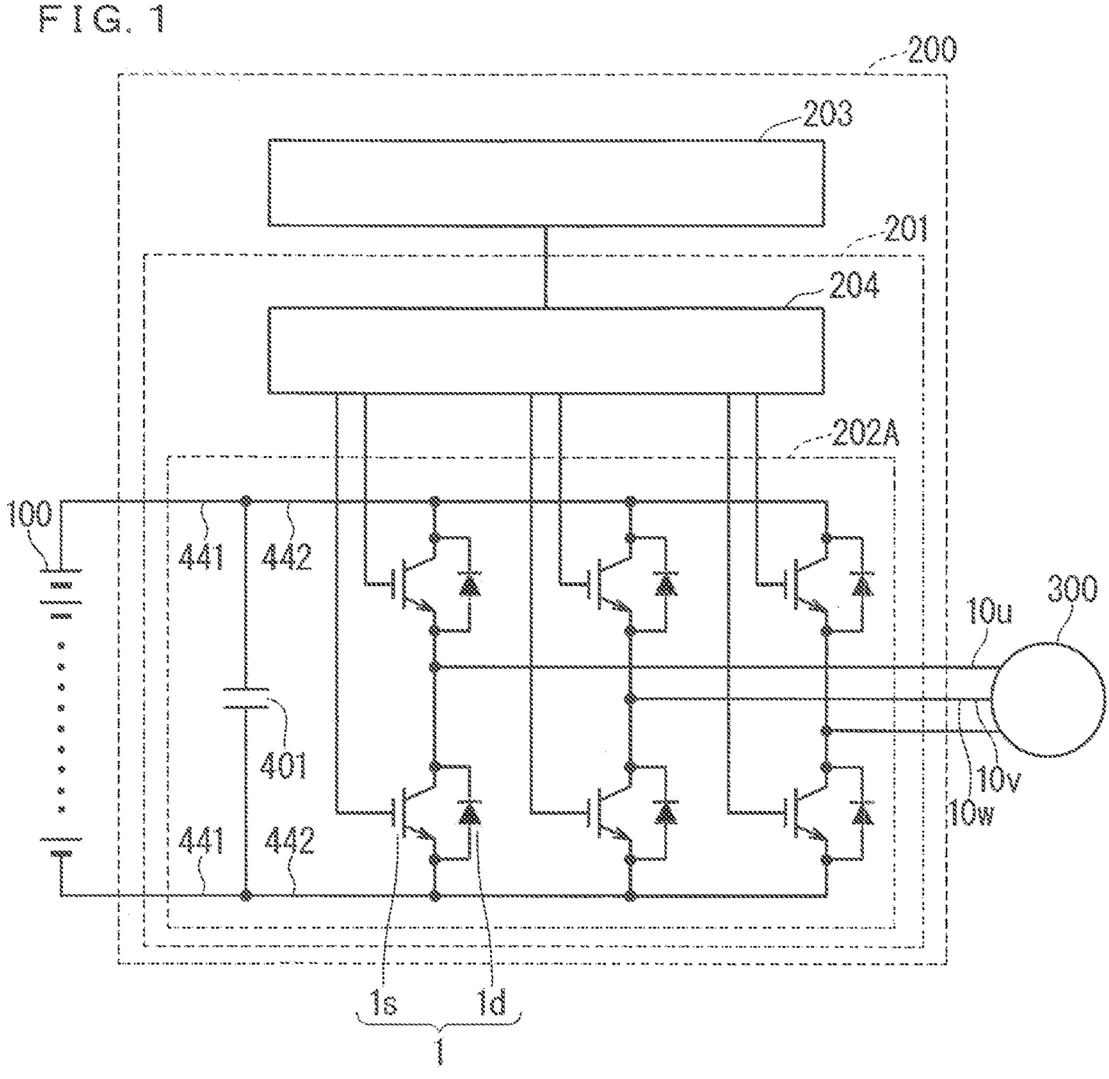
FIG. 1 is a block diagram schematically illustrating a configuration of a power conversion system according to an embodiment 1.

An embodiment is described hereinafter using the drawings. The same reference numerals are assigned to the same or a corresponding part in the drawings hereinafter, and the repetitive description is omitted.

Embodiment 1

(Configuration of Power Conversion Device)

FIG. 1 is a block diagram schematically illustrating a configuration of a power conversion system according to an embodiment 1. The power conversion system is made up of a power source 100, a power conversion device 200, and a load 300. The power source 100, which is a direct current power source, supplies direct current power to the power conversion device 200. The power source 100 can be made up of various types of components such as a direct current system, a solar battery, or a rechargeable battery, or may be also made up of a rectifying circuit connected to an alternating current system or an AC/DC converter, for example. The power source 100 may also be made up of a DC/DC converter which converts direct current power outputted from the direct current system into predetermined power.

The power conversion device 200, which is a three-phase inverter connected between the power source 100 and the load 300, converts the direct current power supplied from the power source 100 into the alternating current power to supply the alternating current power to the load 300. As illustrated in FIG. 1, the power conversion device 200 includes a main conversion circuit 201 which converts the direct current power (inputted power) into the alternating current power and a control circuit 203 which outputs a control signal for controlling the main conversion circuit 201 to the main conversion circuit 201.

The load 300 is a three-phase electrical motor driven by the alternating current power supplied from the power conversion device 200. The load 300 is not for specific purpose of use but is the electrical motor mounted to various types of electrical apparatuses; thus it is used as the electrical motor for a hybrid car, an electrical car, a rail vehicle, an elevator, or an air-conditioning equipment, for example.

The power conversion device 200 is described in detail hereinafter. The main conversion circuit 201 includes a semiconductor device 202A. The semiconductor device 202A includes at least one semiconductor element 1. At least one semiconductor element 1 includes a switching element 1*s*. At least one semiconductor element 1 may also include a reflux diode 1*d*. When a switching is performed on the switching element 1*s*, the main conversion circuit 201 converts the direct current power supplied from the power source 100 into the alternating current power and then supplies the alternating current power to the load 300. The main conversion circuit 201 includes various types of specific circuit configurations, and the main conversion circuit 201 according to the present embodiment is a three-phase full-bridge circuit having two levels, and can be made up of six switching elements 1*s* and six reflux diodes 1*d* being antiparallel to each switching element 1*s*. Every two switching elements 1*s* in six switching elements 1*s* are connected in series with each other to constitute upper and lower arms, and each of the upper and lower arms constitutes each phase (U-phase, V-phase, and W-phase) of the full-bridge circuit. Output terminals 10*u*, 10*v*, and 10*w* of each of the upper and lower arms, that is to say, three output terminals 10*u*, 10*v*, and 10*w* of the main conversion circuit corresponding to these U-phase, V-phase, and W-phase, respectively, are connected to the load 300. The semiconductor element 1 may be a wide bandgap semiconductor element, and may be a silicon carbide semiconductor element, for example.

The main conversion circuit 201 includes a drive circuit 204 driving each switching element 1*s*. The drive circuit 204 may be provided separately from the semiconductor device 202A, or may be built in the semiconductor device 202A as a modification example. The drive circuit 204 generates a drive signal for driving the switching element 1*s* of the main conversion circuit 201, and supplies the drive signal to a control electrode of the switching element 1*s* of the main conversion circuit 201. Specifically, the drive circuit 204 outputs a drive signal for switching the switching element 1*s* to an ON state and a drive signal for switching the switching element 1*s* to an OFF state to the control electrode of each switching element 1*s* in accordance with the control signal from the control circuit 203. The drive signal is voltage signal (ON signal) equal to or higher than threshold voltage of the switching element 1*s* when the switching element 1*s* is kept in the ON state, and the drive signal is voltage signal (OFF signal) equal to or lower than the threshold voltage of the switching element when the switching element 1*s* is kept in the OFF state.

The control circuit 203 controls the switching element 1*s* of the main conversion circuit 201 to supply desired power to the load 300. Specifically, the control circuit 203 calculates a time when each switching element 1*s* of the main conversion circuit 201 needs to enter the ON state (ON time), based on the electrical power which needs to be supplied to the load 300. For example, the main conversion circuit 201 can be controlled by performing PWM control for modulating an ON time of the switching element 1*s* in accordance with the voltage which needs to be outputted. Then, the control circuit 203 outputs a control instruction (control signal) to the drive circuit 204 so that the drive circuit 204 outputs the ON signal to the switching element 1*s* which needs to enter the ON state and outputs the OFF signal to the switching element 1*s* which needs to enter the OFF state at each time. The drive circuit 204 outputs the ON signal or the OFF signal as the drive signal to the control electrode of each switching element in accordance with the control signal.

In the power conversion device 200 according to the present embodiment, applied is the semiconductor device 202A (or a semiconductor device according to the other embodiment described hereinafter) including at least one of the switching element 1*s* and the reflux diode 1*d* of the main conversion circuit 201. Accordingly, conversion efficiency of the power conversion device can be increased.

Described in the present embodiment is an example that the semiconductor device described above is applied to the three-phase inverter of two levels; however, the application of the semiconductor device is not limited thereto, but the semiconductor device can be applied to various power conversion device. For example, the semiconductor device may be applied to a power conversion device of three or multi levels, or may also be applied to a single-phase inverter when electrical power is supplied to a single-phase load. The semiconductor device can also be applied to a DC/DC converter or an AC/DC converter when the electrical power is supplied to a direct current load, for example.

The load 300 of the power conversion device 200 is not limited to the electrical motor, but may also be an electrical discharge machine, a laser cutting machine, an induction cooking machine, or a non-contact power supply system, for example. The power conversion device 200 can also be used as a power conditioner such as a solar power generation system or a power storage system.

(Configuration of Semiconductor Device)

Figure 2:
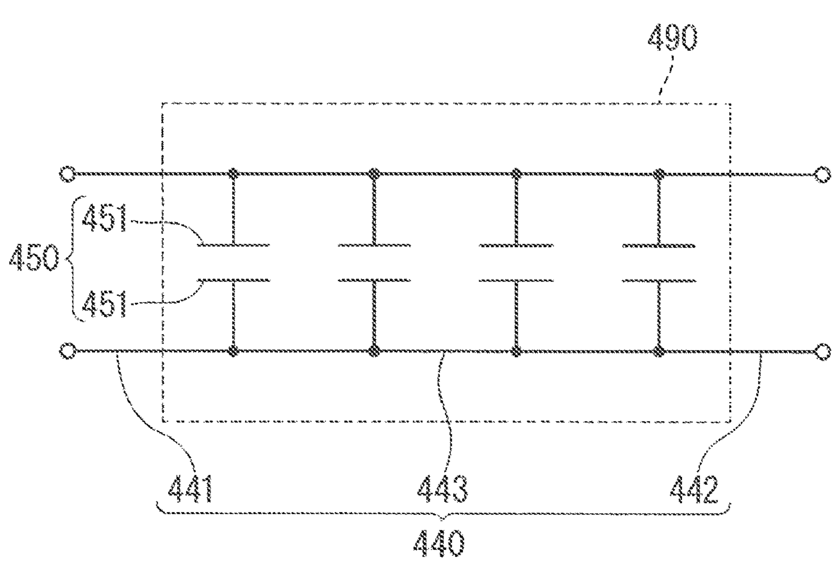
FIG. 2 is a schematic diagram illustrating a configuration of a smoothing capacitor in FIG. 1.

As illustrated in a circuit diagram in FIG. 1, the semiconductor device 202A includes a smoothing capacitor 401 electrically connected to the power source 100. Referring to FIG. 2, the smoothing capacitor 401 includes at least one capacitor element 450, a capacitor case 490, and a plurality of terminals 442. Each capacitor element 450 includes a pair of inner electrodes 451 forming capacitance. The capacitor case 490 houses the capacitor element 450 including the inner electrode 451. The capacitor element 450 is a film capacitor, for example. At least one capacitor element 450 descried above may be the plurality of capacitor elements 450, and in such a case, the smoothing capacitor 401 is a capacitor module. Each terminal 442 protrudes from the capacitor case 490 seamlessly. Each terminal 442 is a copper electrode extending continuously, for example. The plurality of terminals 442 includes a pair of terminals (High terminal and Low terminal) for discharge and charge of the smoothing capacitor 401.

The terminal 442 may be a part of a bus-bar 440. The bus-bar 440 may connect the plurality of capacitor elements 450 in parallel to each other in the capacitor case 490. For example, a plurality of film capacitors are arranged between the pair of bus-bars 440 extending in the capacitor case 490. Each bus-bar 440 may be a copper electrode extending continuously. The bus-bar 440 may include a pair of power source terminals 441 (High terminal and Low terminal) protruding from the capacitor case 490. The power source 100 (FIG. 1) is connected to the power source terminal 441. It is also applicable as a modification example that the power source terminal 441 is omitted and the power source 100 is electrically connected to the terminal 442.

Figure 3:
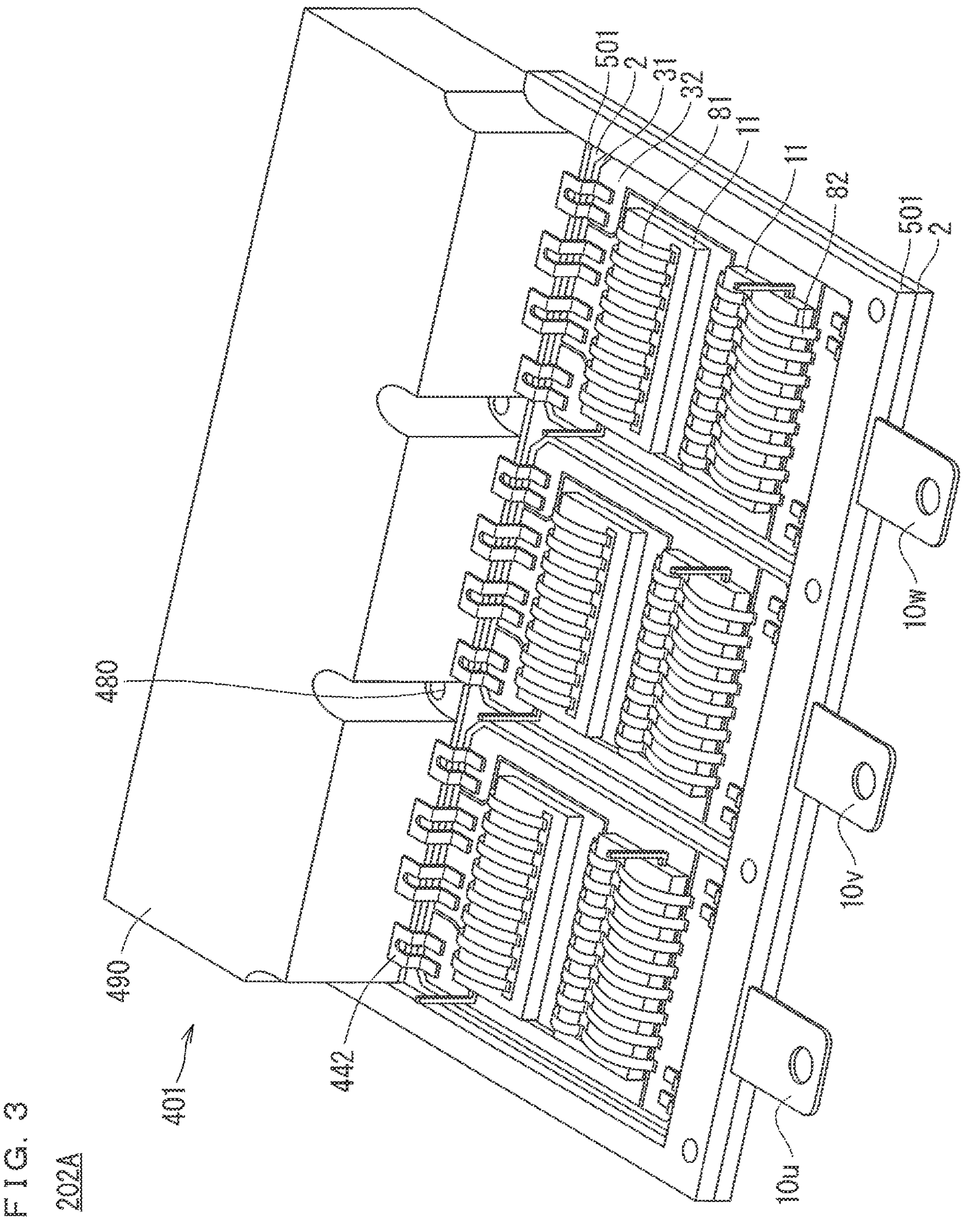
FIG. 3 is a perspective view schematically illustrating a configuration of a semiconductor device included in the power conversion device in FIG. 1.

Referring to FIG. 3, when the semiconductor device 202A constitutes a 6in1 three-phase full-bridge circuit (refer to FIG. 1), three pairs or more (six terminals or more) terminals 442 are provided to the smoothing capacitor 401. At least a pair of terminals 442 are provided for each phase, and two pairs of terminals 442 are provided to each phase in the example illustrated in FIG. 3; thus six pairs of terminals 442 (twelve terminals) in total are provided.

Figure 4:
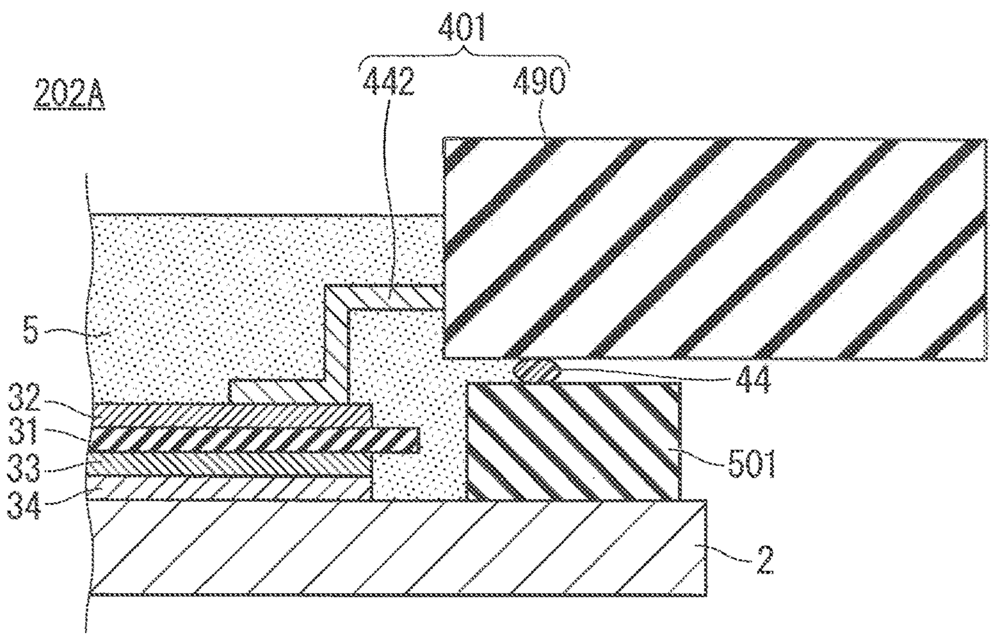
FIG. 4 is a partial cross-sectional view illustrating a semiconductor device in FIG. 3.

Referring to FIG. 3 and FIG. 4, the semiconductor device 202A includes a cooler 2, an insulating substrate 31, a circuit pattern 32, a submodule 11, the smoothing capacitor 401, and a sealing portion 5 (first sealing portion). The submodule 11 is described in detail hereinafter, and includes the plurality of semiconductor elements 1 (refer to FIG. 1). Illustration of the sealing portion 5 is omitted in FIG. 3 to see an inner part of the sealing portion 5. A fixing member 61 or a fixing member 62 described hereinafter (not shown in FIG. 3) may be attached to a fixed part 480 in FIG. 3.

The cooler 2 is a member having high heat radiation properties. The cooler 2 may be a metal member. The metal member may be a member made of copper or aluminum, and a surface thereof may be covered by nickel. The metal member may be a base plate including a cooling surface. The cooling surface may be provided with a pin fin.

The insulating substrate 31 is a ceramic substrate made of silicon nitride, for example. The circuit pattern 32 and a metal film 33 are formed on an upper surface and a lower surface of the insulating substrate 31. The insulating substrate 31, the circuit pattern 32 and the metal film 33 constitute a circuit substrate. The circuit pattern 32 and the metal film 33 are made of copper, for example. The insulating substrate 31 is mounted on the cooler 2 so that the metal film 33 faces the cooler 2. The insulating substrate 31 is mounted via a bonding layer 34 in FIG. 4. The submodule 11 (FIG. 3) is electrically connected to the circuit pattern 32. The smoothing capacitor 401 is disposed not to be overlapped with the semiconductor element 1 in a plan view. In the present specification, the plan view corresponds to a layout in an in-plane direction perpendicular to a thickness direction (vertical direction in FIG. 4).

The sealing portion 5 covers at least a part of each of the terminal 442 of the smoothing capacitor 401, the insulating substrate 31, and the circuit pattern 32. As illustrated in FIG. 4, the sealing portion 5 covers a part of the terminal 442 connected on the circuit pattern 32.

The terminal 442 of the smoothing capacitor 401 and the circuit pattern 32 are directly connected to each other by bonding force of an interface between the terminal 442 and the circuit pattern 32. A heat resisting temperature of the smoothing capacitor 401 is generally low; thus preferable is a method of connecting the terminal 442 of the smoothing capacitor 401 to the circuit pattern 32 which does not excessively increase a temperature in the capacitor case 490. For example, ultrasonic bonding or laser bonding is preferable.

Figure 5:
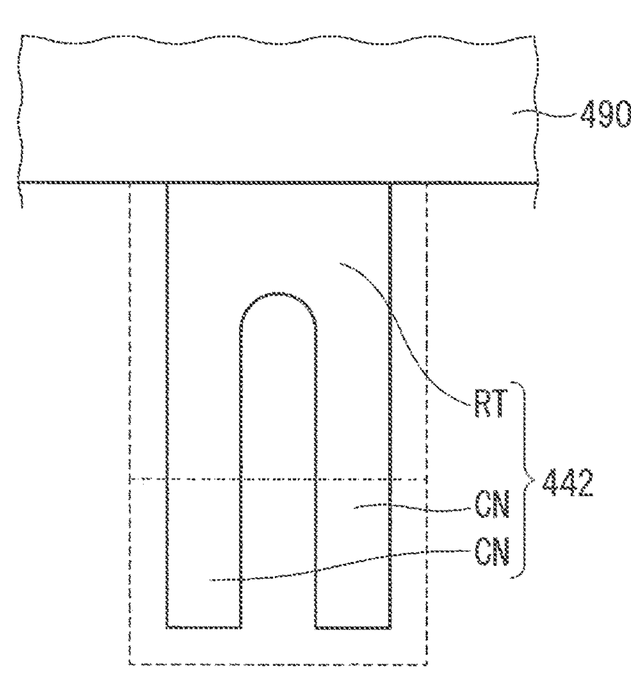
FIG. 5 is a partial top view schematically illustrating a configuration near a terminal of the smoothing capacitor in FIG. 3.

FIG. 5 is a partial top view schematically illustrating a configuration near the terminal 442 of the smoothing capacitor 401. Each terminal 442 includes a root part RT and at least one connection part CN. The root part RT extends from the capacitor case 490 to be away from the circuit pattern 32. The connection part CN extends from the root part RT, and is directly connected to the circuit pattern 32.

As illustrated in FIG. 3, each terminal 442 may include at least one bending part, and includes two bending parts in the illustrated example. Particularly, when the terminal 442 includes the root part RT and the connection part CN as described above, the terminal 442 may include one bending part between the connection part CN and the root part RT, and in the example illustrated in FIG. 3, the terminal 442 includes one more bending part in a reverse direction in the root part RT. A desired difference can be provided between a height direction in which the terminal 442 protrudes from the capacitor case 490 and a height direction in which the terminal 442 is connected to the circuit pattern 32 by the bending part described above.

The circuit pattern 32 may be made up of a conductor flat plate bonded on the insulating substrate 31 with substantially a certain thickness and provided with a pattern shape. As a modification example, the circuit pattern 32 may also include an additional conductor member on the conductor plate described above for a purpose of improving damage tolerance of the circuit pattern 32 against the bonding of the terminal 442 or adjusting a height position in which the terminal 442 is bonded, for example. The conductor member is disposed only within a range overlapped with the conductor flat plate described above in a plan view to suppress negative influence on the wiring inductance. When the purpose described above is unnecessary, the circuit pattern 32 is preferably made up of only a conductor flat plate on the insulating substrate 31 without the conductor member described above. In other words, it is preferable that the terminal 442 is directly bonded to the conductor flat plate described above as the circuit pattern 32. A fastening member such as a screw is not used for bonding the terminal 442 to the circuit pattern 32 regardless of whether or not the additional conductor member described above is used. The reason is that securement of a position where the fastening member is applied easily leads to significant increase in the wiring inductance.

The sealing portion 5 contains gel or rubber. Accordingly, a portion of the sealing portion 5 is a gel-like portion or a rubber-like portion, thus has a low degree of elasticity. The sealing portion 5 is made of gel or rubber, for example.

Figure 6:
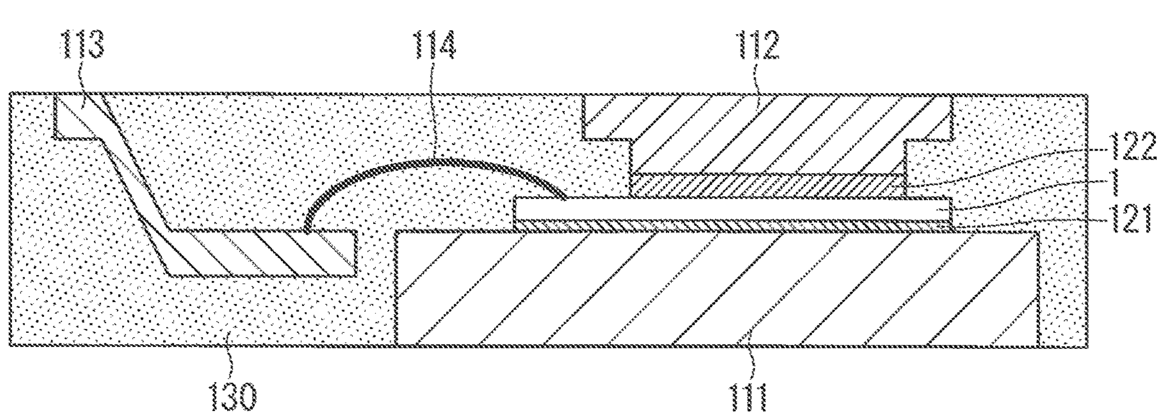
FIG. 6 is a cross-sectional view schematically illustrating a configuration of a submodule included in the semiconductor device in FIG. 3.

FIG. 6 is a cross-sectional view schematically illustrating a configuration of the submodule 11 (refer to FIG. 3). The submodule 11 includes the plurality of semiconductor elements 1 (refer to FIG. 1). The semiconductor element 1 may be a chip component including a lower electrode and an upper electrode on each of the lower surface (first main surface) and the upper surface (second main surface). Each submodule 11 includes the plurality of semiconductor elements 1, a conductor part 111 (first conductor part) connected to the lower electrode of each semiconductor element 1 and a conductor part 112 (second conductor part) connected to the upper electrode of each semiconductor element 1. The semiconductor element 1 may be connected to the conductor part 111 and the conductor part 112 using a bonding layer 121 and a bonding layer 122, respectively. The bonding layer 121 and the bonding layer 122 are sintering members made of silver or copper, for example. The conductor part 111 is a heat spreader made of copper, for example. The conductor part 112 is a plate-like metal plate made of copper or silver, for example, and as illustrated in FIG. 6, a surface thereof connected to the semiconductor element 1 may protrude from the plate surface. Accordingly, the conductor part 112 may be connected to only a part of the upper surface of the semiconductor element 1. The submodule 11 may further include a conductor part 113 (third conductor part) electrically connected to a control electrode provided to the upper surface of the semiconductor element 1. This connection may be performed by a wire 114. The conductor part 112 protrudes as described above; thus an electrical short circuit between the conductor part 112 and the wire 114 is easily prevented.

Furthermore, the submodule 11 includes a sealing portion 130 (second sealing portion). The sealing portion 130 covers only a part of each of the conductor part 111, the conductor part 112, and the conductor part 113 to seal the semiconductor element 1.

As illustrated in FIG. 3, the submodule 11 may be mounted on the circuit pattern 32; thus the lower surface of the semiconductor element 1 is electrically connected to the circuit pattern 32 via the conductor part 111. The submodule 11 is mounted using a solder member or a sintering member, for example, and electrical and thermal connection is thereby ensured. Specifically, the conductor part 111 is connected to the circuit pattern 32. A process for this connection is preferably performed at a lower temperature than a melting point of the bonding layer 121 and the bonding layer 122.

The conductor part (FIG. 6) of the submodule 11 may be connected to at least one of the circuit pattern 32 and the other submodule 11 by a metal ribbon 81 and a metal ribbon 82 (FIG. 3). A wire may be used in place of the ribbon. As a modification example, the conductor part 112 may extend to be connected to at least one of the circuit pattern 32 and the other submodule 11. The connection described above is performed by ultrasonic bonding or bonding by a bonding portion such as solder, for example.

As a modification example, it is also applicable that the semiconductor element 1 is not in a state of the submodule 11 but is electrically connected to the circuit pattern 32. Specifically, a semiconductor chip itself as the semiconductor element 1 may be mounted on the circuit pattern 32.

As illustrated in FIG. 4, the semiconductor device 202A includes a substrate case 501 and a sealing member 44. The substrate case 501 includes a lower surface (first surface) facing the cooler 2 and an upper surface (second surface opposite to the first surface). The sealing member 44 is provided between the upper surface of the substrate case 501 and the smoothing capacitor 401. The sealing member 44 is made of a material having a lower degree of elasticity than each of a material of the substrate case 501 and a material of the capacitor case 490 of the smoothing capacitor 401. The sealing member 44 prevents leakage of the sealing portion 5 from between the substrate case 501 and the smoothing capacitor 401 in a process of filling a space with the sealing portion 5. In other words, the sealing member 44 prevents leakage of a material having flowability for forming the sealing portion 5 from between the substrate case 501 and the smoothing capacitor 401 in a process of filling a space with the material. The sealing member 44 preferably contains rubber particularly in the present embodiment, and is made of rubber, for example. Accordingly, the sealing member 44 can be a rubber-like member.

Figure 7:
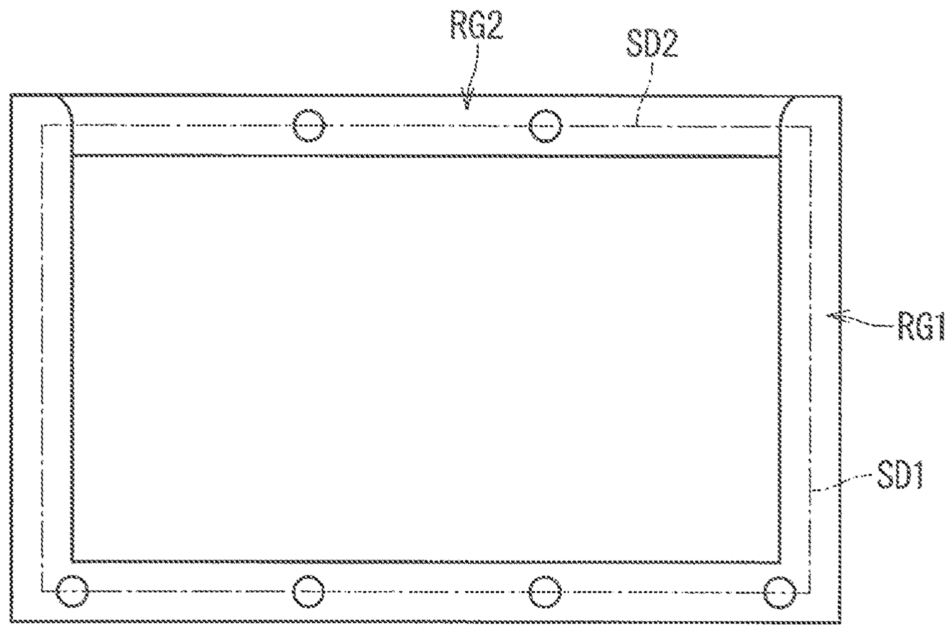
FIG. 7 is a top view schematically illustrating a configuration of a substrate case included in the semiconductor device in FIG. 3.

The substrate case 501 extends to surround the insulating substrate 31 (FIG. 4) on the cooler 2 (FIG. 4) along a closed curve (dash-dotted line in FIG. 7) including a plurality of sides including a first side SD1 and a second side SD2. As illustrated in FIG. 7, the upper surface of the substrate case 501 includes a first region RG1 corresponding to the first side SD1 and a second region RG2 corresponding to the second side SD2. The second region RG2 is lower than the first region RG1 in a thickness direction (direction perpendicular to a field in FIG. 7). The closed curve described above may have substantially a rectangular shape as illustrated in FIG. 7, and a corner part thereof may be rounded. The capacitor case 490 (FIG. 3) of the smoothing capacitor 401 is attached on the second region RG2 in the upper surface of the substrate case 501 (FIG. 7) via the sealing member 44 (FIG. 4). Thus, the capacitor case 490 (FIG. 3) is fitted in a lowered part of the substrate case 501. An inner side of the substrate case 501 and the smoothing capacitor 401 incorporated with each other in such a manner is filled with the sealing portion 5 (FIG. 4).

The substrate case 501 and the cooler 2 may be attached to each other using a screw-like fixing member or an adhesive member or both of them. The substrate case 501 may be made up of an insulator, and is made of resin, for example. Output terminals 10*u* to 10*w* (FIG. 1) may pass through the substrate case 501 as illustrated in FIG. 3. In FIG. 3, each of the output terminals 10*u* to 10*w* passing through the substrate case 501 is connected on the circuit pattern 32.

(Example of Manufacturing Method)

Figure 8:
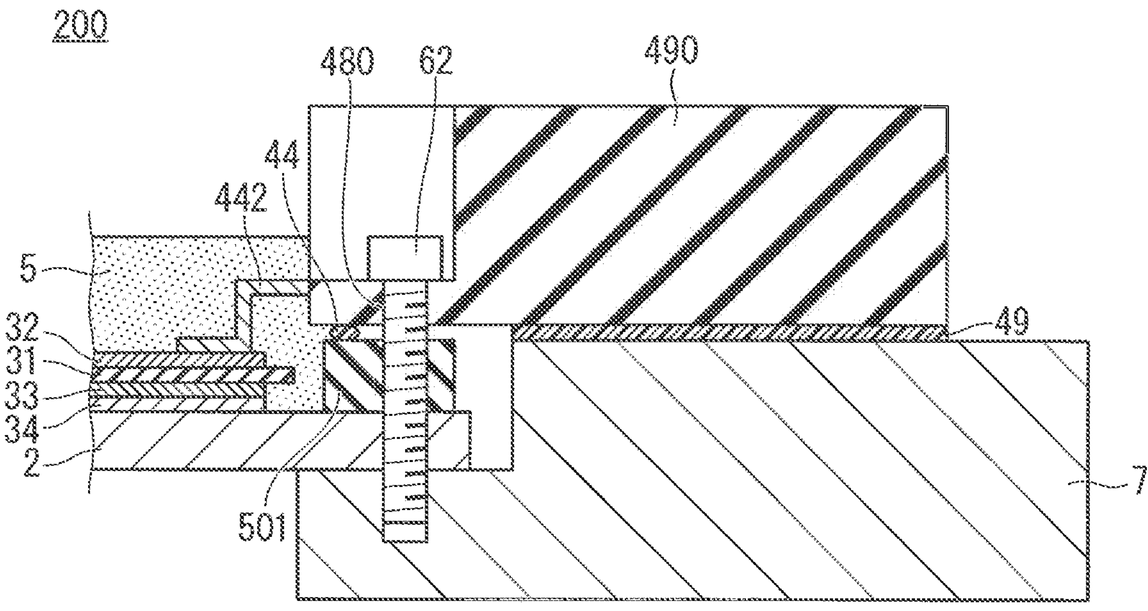
FIG. 8 is a partial cross-sectional view schematically illustrating a configuration of a power conversion device in FIG. 1.

FIG. 8 is a partial cross-sectional view schematically illustrating a configuration of the power conversion device 200 (FIG. 1) including the semiconductor device 202A, and a manufacturing method thereof is exemplified hereinafter. The power conversion device 200 is also a type of semiconductor device.

The power conversion device 200 includes the fixing member 62 (second fixing member) and a housing 7. The housing 7 is attached to the cooler 2 using the fixing member 62. The fixing member 62 is a screw-like fastening member, for example. The capacitor case 490 of the smoothing capacitor 401 includes the fixed part 480 for applying the fixing member 62. When the fixing member 62 is a screw-like fastening member, the fixed part 480 may be a screw hole. The fixing member 62 fixes the fixed part 480 in the capacitor case 490 of the smoothing capacitor 401, the cooler 2, and the housing 7.

A method of manufacturing the power conversion device 200 (FIG. 8) including the semiconductor device 202A is described hereinafter next.

Figure 9:
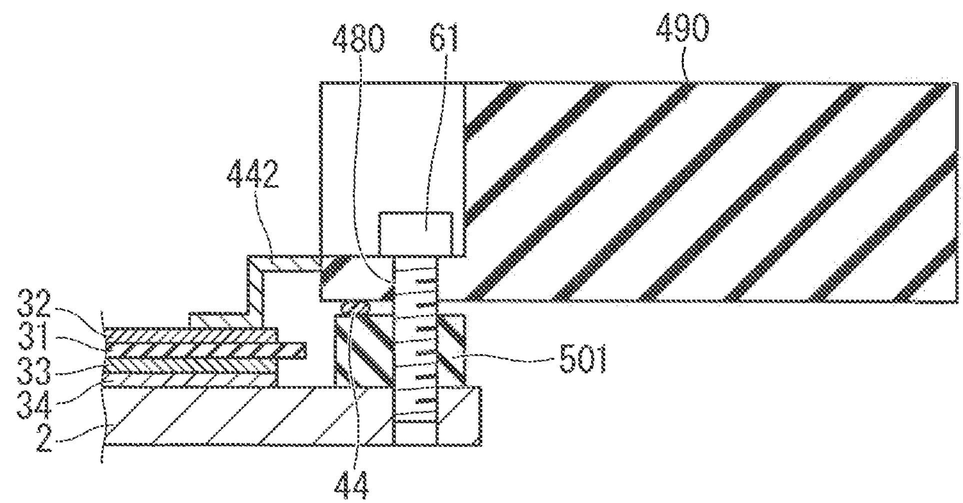
FIG. 9 is a partial cross-sectional view schematically illustrating a first process of a method of manufacturing the power conversion device in FIG. 8.

Referring to FIG. 9, the substrate case 501, the sealing member 44, and the capacitor case 490 are stacked in this order on the cooler 2. The fixed part 480 included in the capacitor case 490 of the smoothing capacitor 401 is fixed to the cooler 2. This fixation is performed by applying the fixing member 61 (first fixing member) to the fixed part 480 in the capacitor case 490 of the smoothing capacitor 401. The fixing member 61 is a screw-like fastening member, for example.

Figure 10:
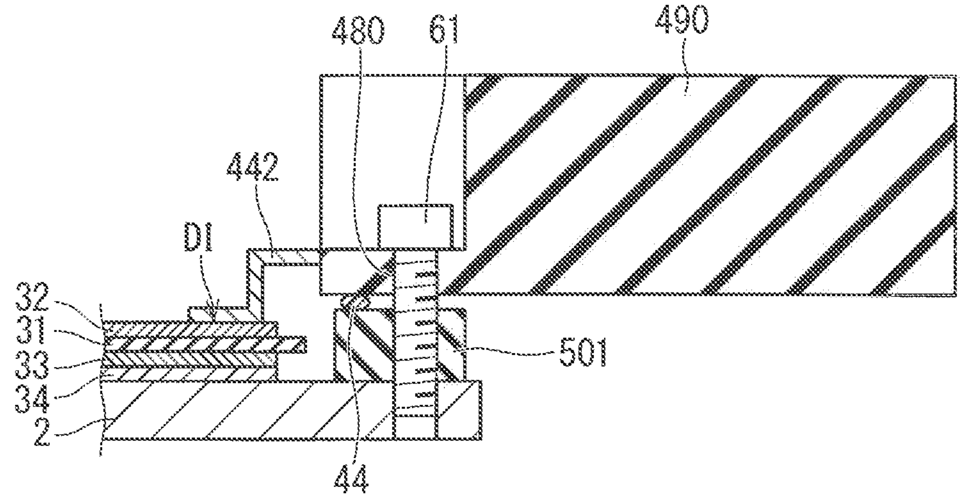
FIG. 10 is a partial cross-sectional view schematically illustrating a second process of the method of manufacturing the power conversion device in FIG. 8.

Subsequently, as illustrated in FIG. 10, the terminal 442 of the smoothing capacitor 401 and the circuit pattern 32 are bonded to each other. Accordingly, the terminal 442 and the circuit pattern 32 are directly connected to each other by bonding force of an interface DI between the terminal 442 and the circuit pattern 32. This bonding is performed by ultrasonic bonding, for example.

Figure 11:
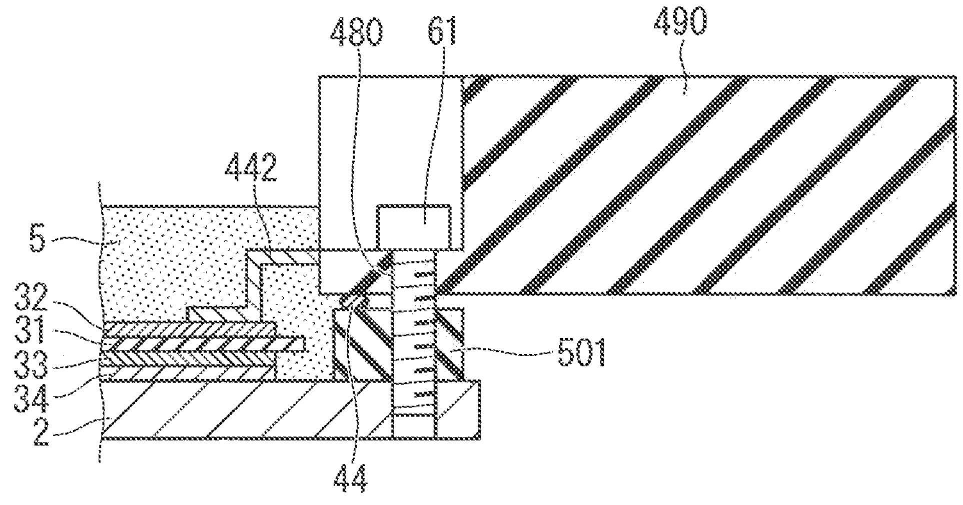
FIG. 11 is a partial cross-sectional view schematically illustrating a third process of the method of manufacturing the power conversion device in FIG. 8.

Referring to FIG. 11, the sealing portion 5 fills an inner part of the substrate case 501. Accordingly, a bonding position between the terminal 442 and the circuit pattern is covered by the sealing portion 5.

Figure 12:
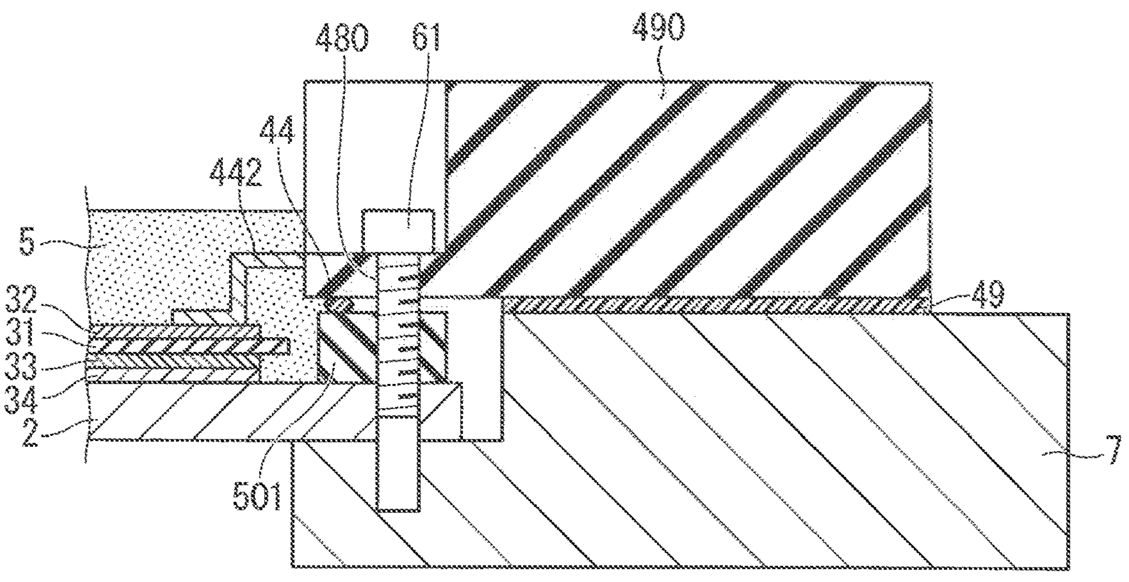
FIG. 12 is a partial cross-sectional view schematically illustrating a fourth process of the method of manufacturing the power conversion device in FIG. 8.
Figure 13:
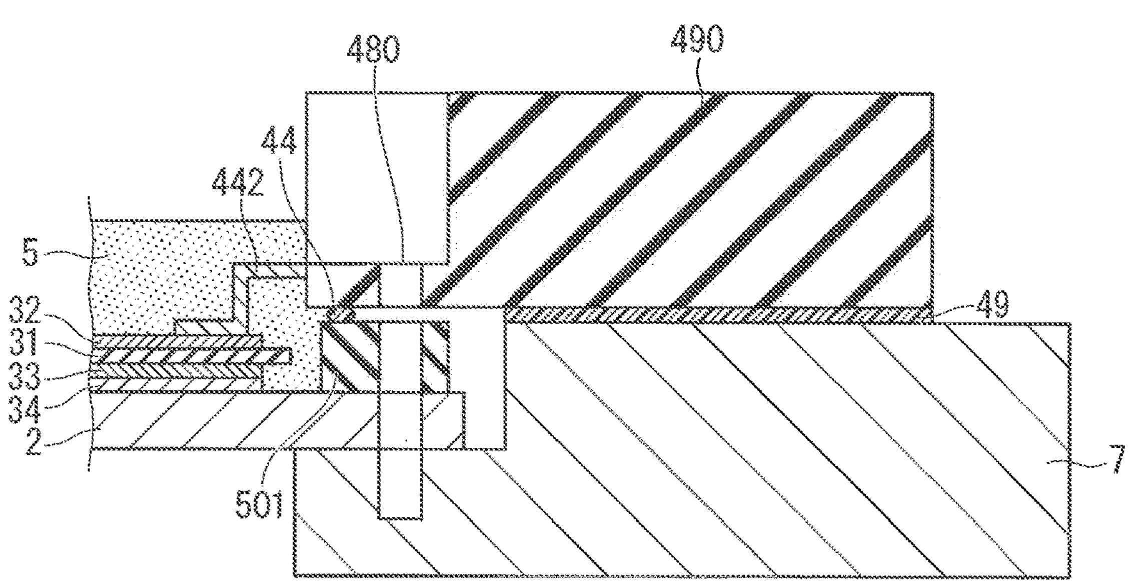
FIG. 13 is a partial cross-sectional view schematically illustrating a fifth process of the method of manufacturing the power conversion device in FIG. 8.

Referring to FIG. 12, the cooler 2 is mounted to the housing 7. A thermal conductive member 49 may be provided therebetween. The thermal conductive member 49 may be a resin sheet, and silicon resin can be used for a member thereof, for example. Alternatively, the thermal conductive member 49 may be a heat radiation grease layer. After the mounting process described above, the fixing member 61 is detached. Accordingly, as illustrated in FIG. 13, the fixed part 480 is opened.

Referring to FIG. 8 again, the fixing member 62 is applied to the fixed part 480 in the capacitor case 490 of the smoothing capacitor 401. Accordingly, the fixed part 480, the cooler 2, and the housing 7 are fixed to each other. When the fixing member 61 and the fixing member 62 are screw-like fastening members, the fixing member 62 (FIG. 8) may be longer than the fixing member 61 (FIG. 12).

Figure 14:
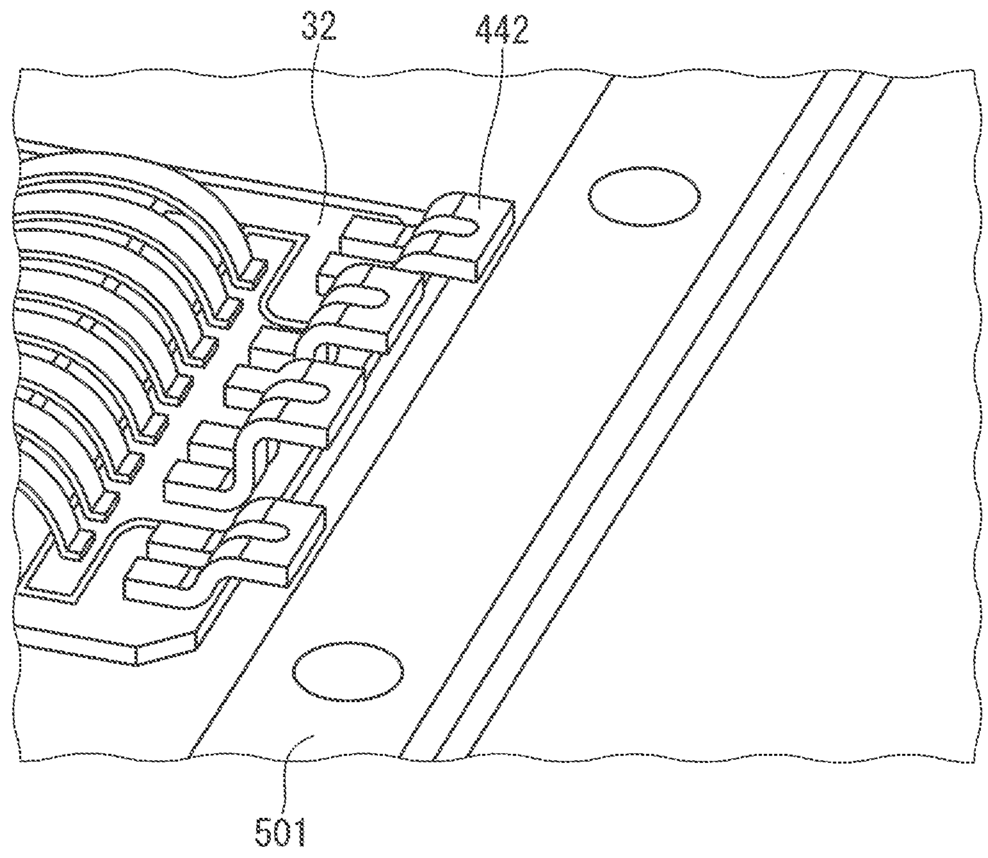
FIG. 14 is a partial perspective view illustrating a simulation model corresponding to the present embodiment.
Figure 15:
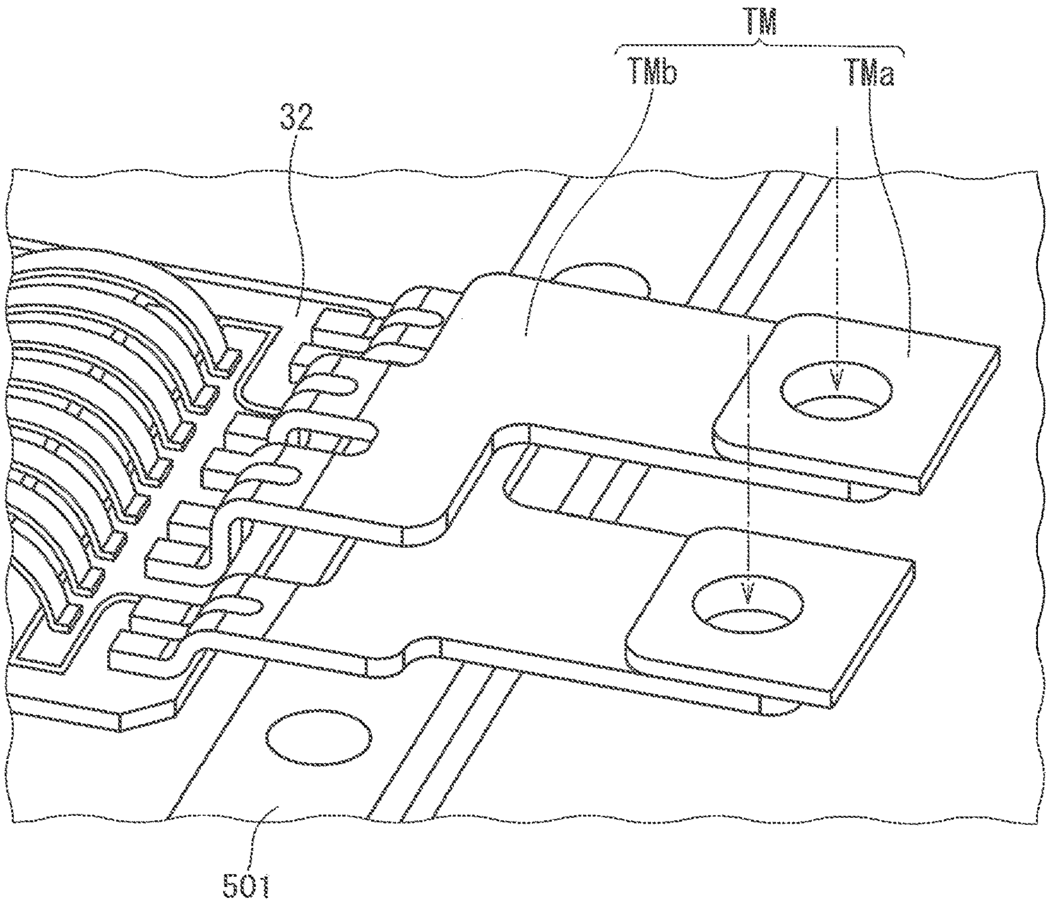
FIG. 15 is a partial perspective view illustrating a simulation model corresponding to a comparative example.
Figure 16:
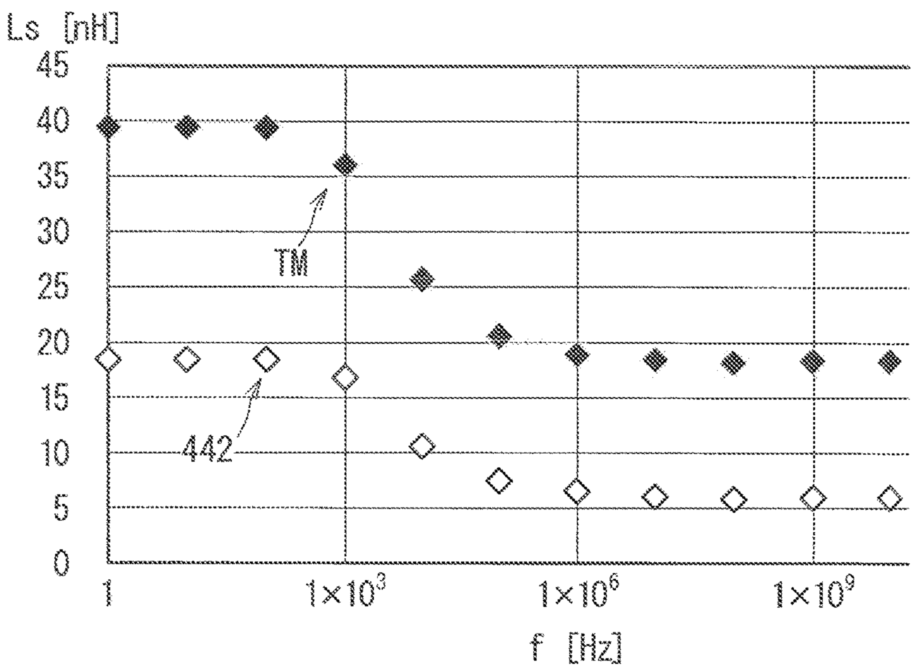
FIG. 16 is a graph chart illustrating a relationship between a frequency and wiring inductance obtained by a simulation using each simulation model in FIG. 14 and FIG. 15.

A result of a simulation of the wiring inductance of the smoothing capacitor is described next. FIG. 14 is a partial perspective view illustrating a simulation model corresponding to the present embodiment, and only the terminal 442 is illustrated in the smoothing capacitor 401 (refer to FIG. 3) in FIG. 14. In the meanwhile, FIG. 15 is a partial perspective view illustrating a simulation model corresponding to a comparative example, and in this model, a wiring TM is provided in place of the terminal 442 as the wiring of the smoothing capacitor. The wiring TM includes a terminal TMa and a protruding member TMb. The terminal TMa protrudes from the capacitor case (not shown in FIG. 15) of the smoothing capacitor seamlessly. The protruding member TMb protrudes from a range overlapped with the circuit pattern 32 in a plan view. Each of the terminal TMa and the protruding member TMb includes a screw hole. A screw (not shown in FIG. 15) is applied to the screw hole as shown by a dash-dotted line in FIG. 15; thus the terminal TMa and the protruding member TMb are fixed to each other. In the comparative example, the smoothing capacitor is assumed to be attached by this fixation. FIG. 16 is a graph chart illustrating an example of a simulation result of a relationship between a frequency f and wiring inductance Ls based on an assumption of a general-purpose semiconductor device for a typical electrical car for each simulation model described above. This result shows that the inductance can be significantly reduced by using the terminal 442 compared with a case of using the wiring TM to which the screw fastening is applied. For example, in a case of f=10 MHz, Ls=6.5 nH of the terminal 442 is reduced to a value smaller than half Ls=19.1 nH of the wiring TM.

(Effect)

According to the present embodiment, firstly, the smoothing capacitor 401 (FIG. 3) is disposed not to be overlapped with the submodule 11 including the semiconductor element 1 (FIG. 6) in a plan view. Accordingly, there is no limitation that the smoothing capacitor 401 is overlapped with the semiconductor element 1 in a plan view; thus easily applied is the wiring location capable of reducing the inductance. Secondly, if a fastening member such as a screw is used in connecting the terminal of the smoothing capacitor 401, the wiring inductance increases due to increase of length of the wiring, and it is also difficult to apply a parallel-plate wiring structure to cancel the increase of the wiring inductance. In contrast, according to the present embodiment, the terminal 442 of the smoothing capacitor 401 and the circuit pattern 32 are directly connected to each other by bonding force of the interface between the terminal 442 and the circuit pattern 32. Accordingly, the capacitor case 490 of the smoothing capacitor 401 can be disposed to be close to the circuit pattern 32. Particularly, when the joint part of the terminal 442 of the smoothing capacitor 401 is sealed by the sealing portion 5 together with the circuit pattern 32, the smoothing capacitor 401 can be connected with substantially a shortest distance without consideration of the creeping distance. Thus, a wiring length can be reduced; thus the wiring inductance can be reduced.

The sealing portion 5 may contain gel or rubber. Accordingly, even when the terminal 442 of the smoothing capacitor 401 is deformed due to an error of a relative attachment position of the smoothing capacitor 401 and the cooler 2 in the case where the semiconductor device 202A is attached to the housing 7 (FIG. 8), for example, occurrence of a detachment or a crack in the sealing portion 5 due to this deformation can be prevented. Accordingly, reliability of the semiconductor device 202A can be enhanced.

The submodule 11 (FIG. 6) is made by the semiconductor element 1; thus the semiconductor element 1 before being mounted to the insulating substrate 31 can be easily inspected. This configuration is described hereinafter.

A heat resisting temperature of a film capacitor generally used as the smoothing capacitor 401 is low such as substantially 100° C.; thus it is difficult to perform a high temperature inspection on the semiconductor element 1 after completion of assembling the semiconductor device 202A. When the high temperature inspection is performed on the submodule 11 including the semiconductor element 1 before assembling the semiconductor device 202A, exposure of the film capacitor to a high temperature in the high temperature inspection can be prevented.

When the semiconductor element 1 is not in a state of the submodule 11 but is in a state of a bare chip, it is hard to perform a withstand voltage test, a rated current test, and a short circuit test; however, these tests can be easily performed when the semiconductor element 1 is in the state of the submodule 11. Specifically, a thermal capacity of the conductor part 111 and the conductor part 112 can absorb temporal and rapid heat generation from the semiconductor element. Thus, the heat from the semiconductor element 1 is diffused in a test in which large current is instantaneously applied such as the short circuit test; thus damage from the heat generation on the element can be suppressed. The sealing portion 130 is included; thus a test under high voltage can be easily performed. A screening test can be collectively performed on the plurality of semiconductor elements 1; thus the screening test can be made efficient.

It is hard to perform the screening test on a bare chip. The screening test is particularly important when the semiconductor element 1 is a silicon carbide semiconductor element to secure a quality thereof. The screening test needs to be performed under strict conditions to reduce a required time for the screening test; however, it is difficult to perform the test under such conditions on the bare chip. For example, relatively large current is assumed to flow in a relatively small area in a silicon carbide semiconductor element; thus it is difficult to apply current to the bare chip in a state close to actual usage condition. In contrast, the test with large current can be easily performed on the submodule 11 by even power conduction between the conductor part 111 and the conductor part 112.

When a wide bandgap semiconductor such as silicon carbide is used, withstand voltage of the semiconductor itself is high; thus a length of a terminal structure of the semiconductor element can be reduced. However, when high voltage is applied to a bare chip in the atmosphere to perform a test, creeping discharge may occur before the voltage reaches original withstand voltage in some cases. In contrast, when the semiconductor chip is in the state of the submodule 11, the terminal structure is covered by the sealing portion 130; thus the test with the high voltage can be performed while suppressing the creeping discharge.

As described above, the test group described above which is difficult to perform on a single body of the semiconductor chip can be performed by using the submodule 11.

When a thickness of the substrate case 501 is excessively small in a case where the substrate case 501 has a frame-like shape with an even thickness, a material (for example, gel) of the sealing portion 5 flows out when the sealing portion 5 is formed in the substrate case 501 in manufacturing the semiconductor device 202A. Conversely, when the thickness of the substrate case 501 is excessively large, the capacitor case 490 and the substrate case 501 easily interfere with each other in adjusting a height position of the capacitor case 490 so that the terminal 442 of the smoothing capacitor 401 is as short as possible. In contrast, according to the present embodiment, a height of the first region RG1 (FIG. 7) is sufficiently large, thereby preventing the material of the sealing portion 5 (FIG. 4) from flowing out, and the smoothing capacitor 401 is attached to the second region RG2 (FIG. 7) lower than the first region RG1; thus the problem of interference described above can be prevented.

When the semiconductor device 202A is attached to the housing 7 (FIG. 8), for example, the smoothing capacitor 401 may be relatively displaced in the semiconductor device 202A due to an error of an attachment dimension. The substrate case 501 or the smoothing capacitor 401 may be broken in some cases due to the large displacement. Occurrence of such a breakage can be suppressed by making a degree of elasticity of a material of the sealing member 44 lower than a material of each of the substrate case 501 and the capacitor case 490. Particularly, when the sealing member 44 is a rubber member, the sealing member 44 can be easily provided.

When cooling water is flowed between the cooler 2 and the housing 7 (FIG. 8), the cooler 2 and the housing 7 need to be fixed to each other at many fixing points in some degree to ensure sufficient watertightness. Particularly, when the power conversion device 200 (FIG. 8) is disposed on a drive structure of an automobile, for example, more fixing points may be needed in some cases to ensure watertightness and endurability under a vibration environment. Applied in the present embodiment is the structure that the smoothing capacitor 401 is integrally formed with the power conversion device 200; thus the fixed part 480 of the smoothing capacitor 401 may be used as a fixing point between the cooler 2 and the housing 7 so that this structure does not have difficulty in ensuring the plurality of fixing points as described above.

A heat resisting temperature of the smoothing capacitor 401 is generally low. In this case, a method of connecting the terminal 442 of the smoothing capacitor 401 to the circuit pattern 32 needs to have a configuration not to excessively increase a temperature in the capacitor case 490. For example, ultrasonic bonding or laser bonding is preferable. In such a case, when a thick terminal is used to ensure a current capacity of each terminal 442, ultrasonic power or laser power needs to be increased for connecting the terminal. As a result, power efficiency is deteriorated or there is concern about damage on the insulating substrate 31. When the terminal 442 includes the plurality of connection parts CN (FIG. 5) separated from each other, the current capacity can be ensured while preventing the problem described above.

When a wide bandgap semiconductor such as SiC is used the semiconductor element 1, a high-speed switching operation is often expected for a purpose of inverter driving at high speed. In such a high-speed operation, a problem of operation loss due to wiring inductance easily occurs; however, according to the present embodiment, this can be effectively suppressed.

The terminal 442 and the circuit pattern 32 may be directly connected to each other by bonding force of the interface DI (FIG. 10) between the terminal 442 and the circuit pattern 32 after the process (FIG. 9) of fixing the fixed part 480 of the capacitor case 490 to the cooler 2. Accordingly, stress applied to the interface DI as the bonding part can be prevented.

The fixing member 61 has a role of temporarily fixing the capacitor case 490 to the cooler 2 in an attachment operation (FIG. 10) of attaching the semiconductor device 202A to the housing 7 or a shipping operation (FIG. 11) of shipping the semiconductor device 202A. In the meanwhile, in a state where the semiconductor device 202A is combined with the housing 7, it is applicable that the fixing member 61 is detached in the fixed part 480 and the fixing member 62 (FIG. 8) which can also fix the housing 7 is applied in place of the fixing member 61. In this case, the common fixed part 480 is used for the fixing member 61 and the fixing member 62; thus an area of locating the fixed part can be reduced, and the semiconductor device 202A can be downsized.

Modification Example of Embodiment 1

Figure 17:
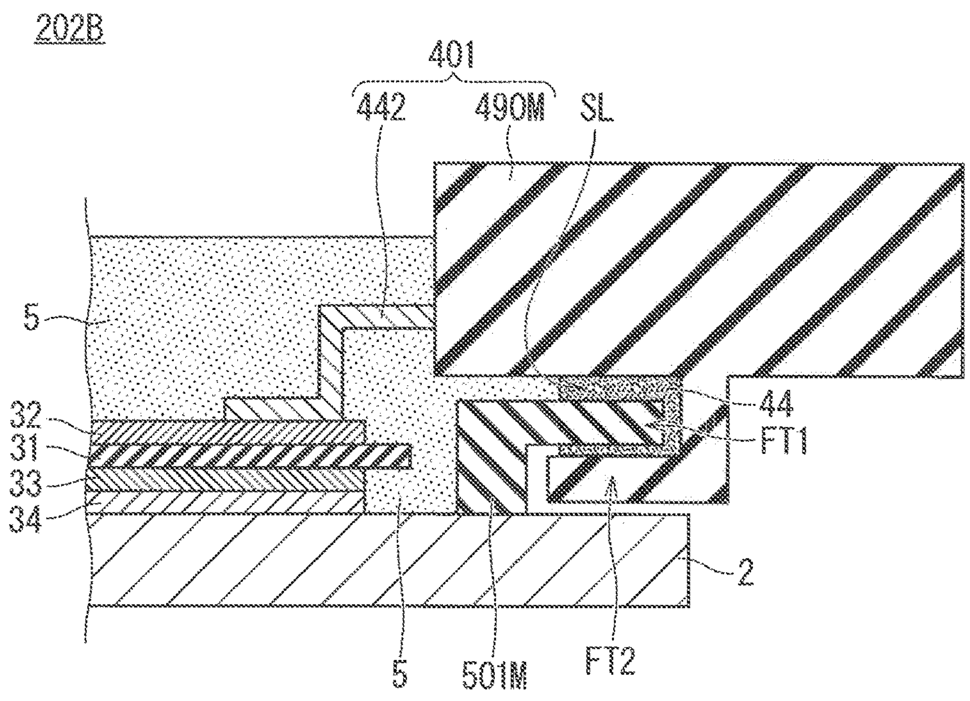
FIG. 17 is a partial cross-sectional view schematically illustrating a configuration of a semiconductor device according to a modification example of the semiconductor device in FIG. 4.

FIG. 17 is a partial cross-sectional view schematically illustrating a configuration of a semiconductor device 202B according to a modification example of the semiconductor device 202A (FIG. 4: embodiment 1). The semiconductor device 202B includes a substrate case 501M and a capacitor case 490M in place of the substrate case 501 and the capacitor case 490 in the semiconductor device. The substrate case 501M includes a fitting part FT1 (first fitting part) provided to a part of the substrate case 501N corresponding to the second side SD2 (FIG. 7). The capacitor case 490M includes a fitting part FT2 (second fitting part) with a groove SL into which the fitting part FT1 is inserted. An interval between the fitting part FT1 and the cooler 2 is preferably larger than a thickness of the fitting part FT2 in consideration of a mounting tolerance. The sealing member 44 fills a space between the fitting part FT1 and the fitting part FT2 in the groove SL of the fitting part FT2 of the capacitor case 490. The sealing member 44 contains gel, thereby being a gel-like member.

Figure 18:
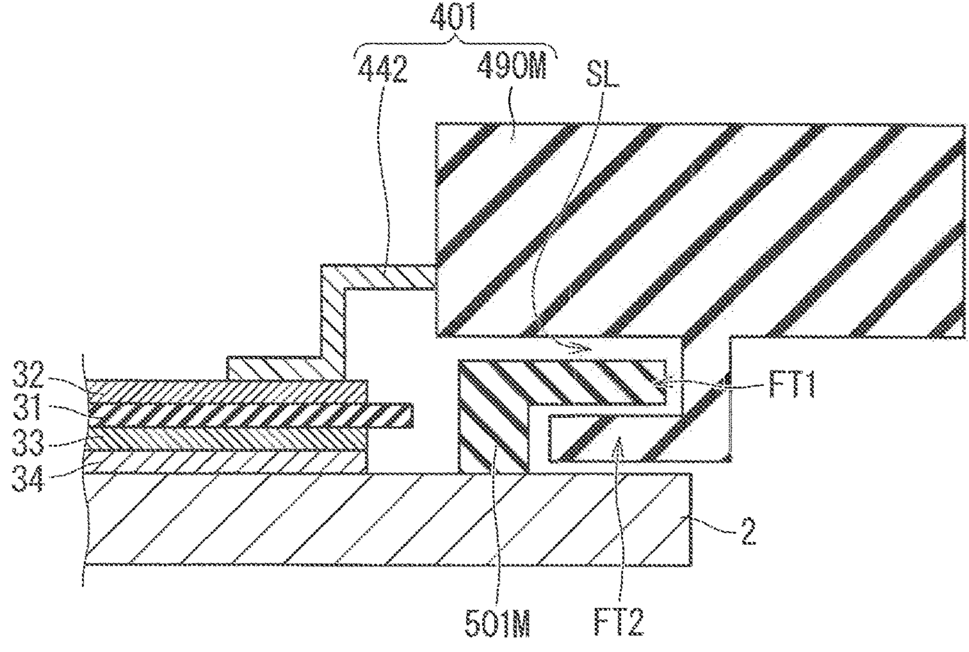
FIG. 18 is a partial cross-sectional view schematically illustrating a first process of a method of manufacturing the semiconductor device in FIG. 17.
Figure 19:
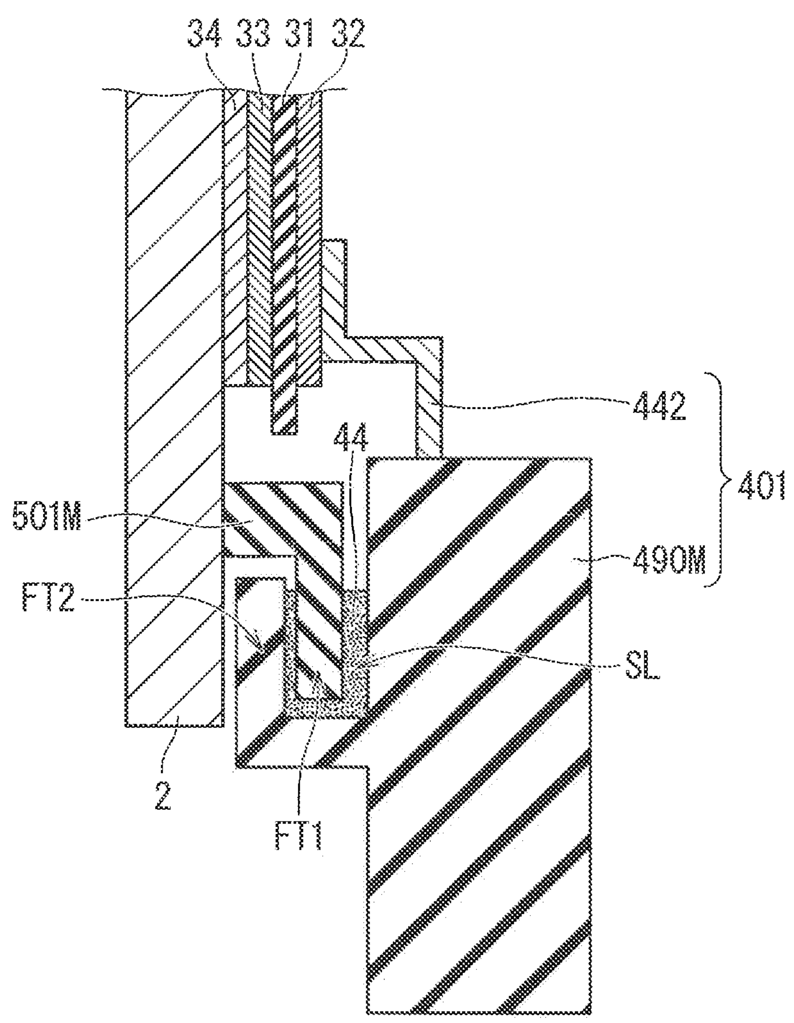
FIG. 19 is a partial cross-sectional view schematically illustrating a second process of the method of manufacturing the semiconductor device in FIG. 17.
Figure 20:
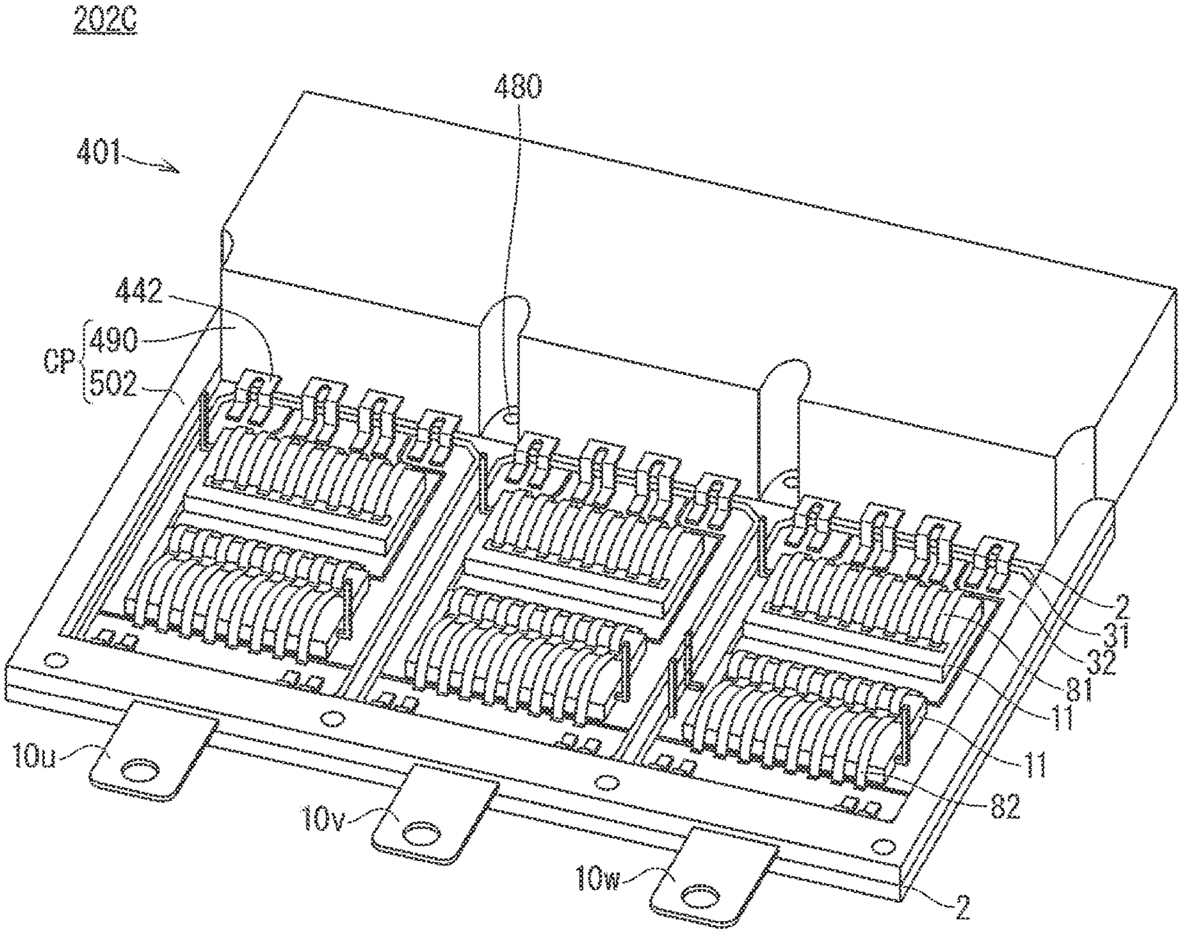
FIG. 20 is a perspective view schematically illustrating a configuration of a semiconductor device according to an embodiment 2.

FIG. 18 and FIG. 19 are partial cross-sectional views schematically illustrating first and second processes of a method of manufacturing the semiconductor device 202B. Referring to FIG. 18, the fitting part FT1 is inserted into the groove SL of the fitting part FT2; thus the fitting part FT1 and the fitting part FT2 are fitted to each other. Referring to FIG. 19, the sealing member 44 containing gel is formed. Specifically, the sealing member 44 fills a space between the fitting part FT1 and the fitting part FT2 in the groove SL of the fitting part FT2. Referring to FIG. 20, the sealing portion 5 containing gel is formed after the sealing member 44 is formed as described above. A posture of a member in process with respect to a gravity direction may be adjusted so that an opening part of the groove SL is directed to an upper side in the process (FIG. 19) of filling the space with the sealing member 44 and the circuit pattern 32 is directed to an upper side in the process (FIG. 17) of forming the sealing portion 5.

A process substantially similar to that according to the embodiment 1 is applied to a process other than that described above; thus the description thereof is omitted.

According to the present modification example, the sealing member 44 can be formed more stably. Accordingly, when the sealing portion 5 using gel fills an inner part of the substrate case 501M, the sealing member 44 can prevent leakage of the sealing portion more reliably.

Embodiment 2

(Configuration)

Figure 21:
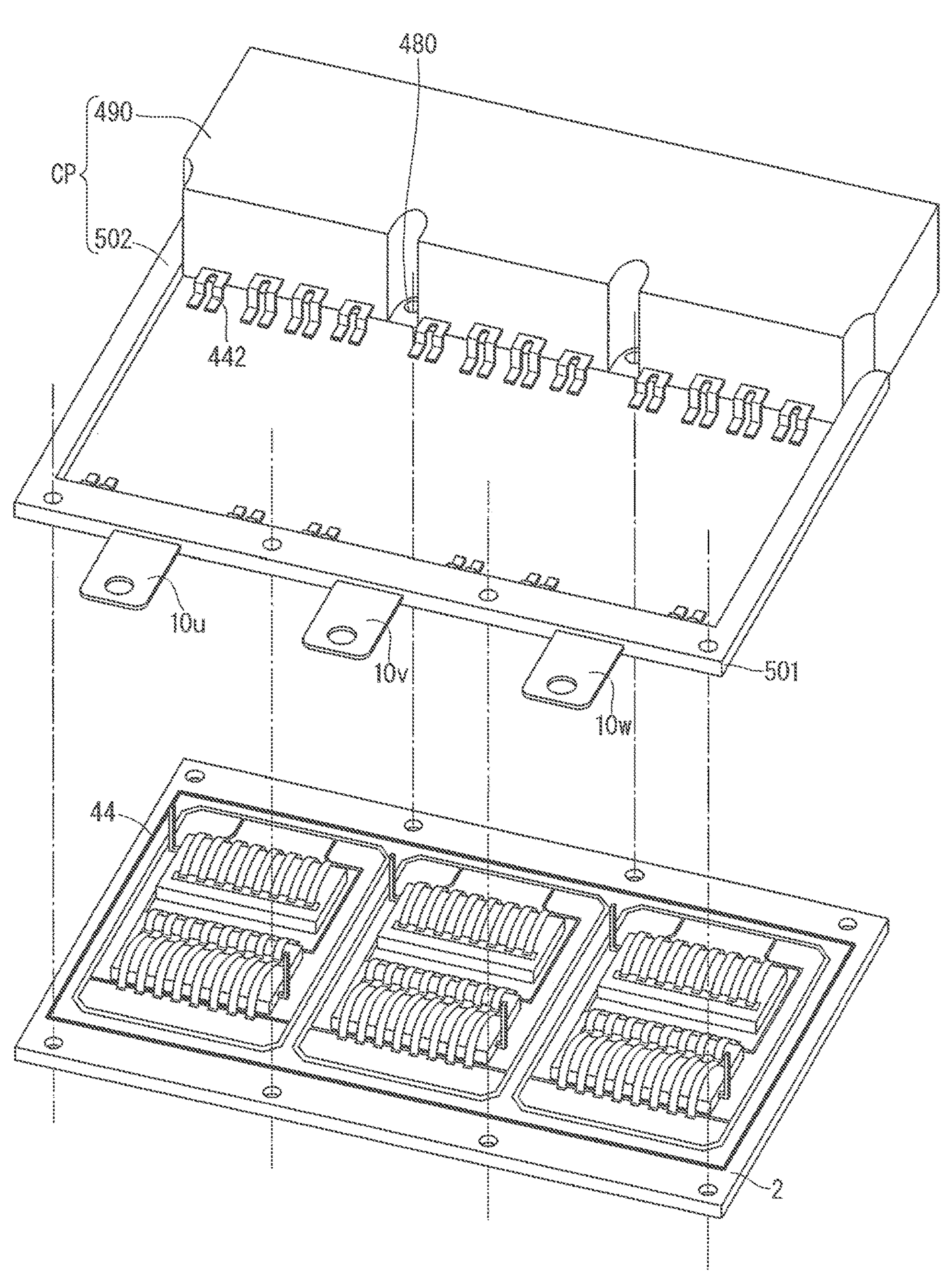
FIG. 21 is an exploded perspective view schematically illustrating the configuration of the semiconductor device in FIG. 20.

FIG. 20 and FIG. 21 are a perspective view and an exploded perspective view each schematically illustrating a configuration of a semiconductor device 202C according to an embodiment 2. Illustration of the sealing portion 5 is omitted in FIG. 20 and FIG. 21 to see an inner part of the sealing portion 5 (refer to FIG. 4) in FIG. 20 and FIG. 21. The fixing member 61 or the fixing member 62 described above (not shown in FIG. 20 and FIG. 21) may be attached to the fixed part 480.

The semiconductor device 202C includes a substrate case 502 in place of the substrate case 501 (FIG. 3: embodiment 1). The substrate case 502 is continuously formed with the capacitor case 490 of the smoothing capacitor 401 to constitute a case part CP together with the capacitor case 490 of the smoothing capacitor 401. Accordingly, the smoothing capacitor 401 and the substrate case 502 are integrally formed. The case part CP surrounds the insulating substrate 31 on the cooler 2. An inner side of the case part CP is filled with the sealing portion 5. The sealing member 44 located between the case part CP and the cooler 2 is made of a material which can be formed at a temperature lower than the heat resisting temperature of the smoothing capacitor 401. The material is a thermoset adhesive agent, for example. A configuration other than that describe above is substantially the same as that according to the embodiment 1 described above; thus the repetitive description is omitted.

(Manufacturing Method)

A method of manufacturing the semiconductor device 202C is described hereinafter next.

Referring to FIG. 21, a laminated body (refer to FIG. 2) including the cooler 2, the insulating substrate 31, and the circuit pattern 32 is prepared firstly. Next, the submodule 11 is mounted in the manner similar to the embodiment 1. The semiconductor element 1 may be mounted as a modification example instead of the submodule 11 in the manner similar to the embodiment 1. Next, the sealing member 44 is formed on the cooler 2 to surround the insulating substrate 31. For example, a thermoset adhesive agent as the sealing member 44 is applied to surround the insulating substrate 31. Attached next is the substrate case 502 integrally formed with the smoothing capacitor 401. Specifically, the case part CP is attached on the sealing member 44 to be overlapped with the sealing member 44 in a plan view. The case part CP and the cooler 2 may be bonded by adhesive force of the sealing member 44. A screw-like fastening member may be used to reinforce the adhesive force or in place of the adhesive force. Next, the terminal 442 of the smoothing capacitor 401 and the circuit pattern 32 are electrically connected to each other in the manner similar to the embodiment 1. Next, an inner part of the case part CP is filled with the sealing portion 5. The sealing portion 5 may be a gel-like portion by containing gel.

(Effect)

According to the present embodiment, the capacitor case 490 and the substrate case 502 are continuously formed as the case part CP. Accordingly, firstly, the case part CP can have a configuration which does not include the gap through which the material of the sealing portion 5 is leaked between the capacitor case 490 and the substrate case 502 from an inner side to an outer side of the case part CP in the process of forming the sealing portion 5. Thus, the capacitor case 490 can ensure the function of sealing the material of the sealing portion 5 more reliably together with the substrate case 502. Thus, sufficiently allowable is a configuration that the capacitor case 490 is disposed on the cooler 2 without intervention of the substrate case 502. Accordingly, the height of the terminal 442 protruding from the capacitor case 490 can be made closer to that of the circuit pattern 32; thus the wiring inductance can be further reduced. Secondly, the capacitor case 490 and the substrate case 502 are integrally formed with each other in advance; thus the assembly operation can be simplified.

Embodiment 3

(Configuration)

Figure 22:
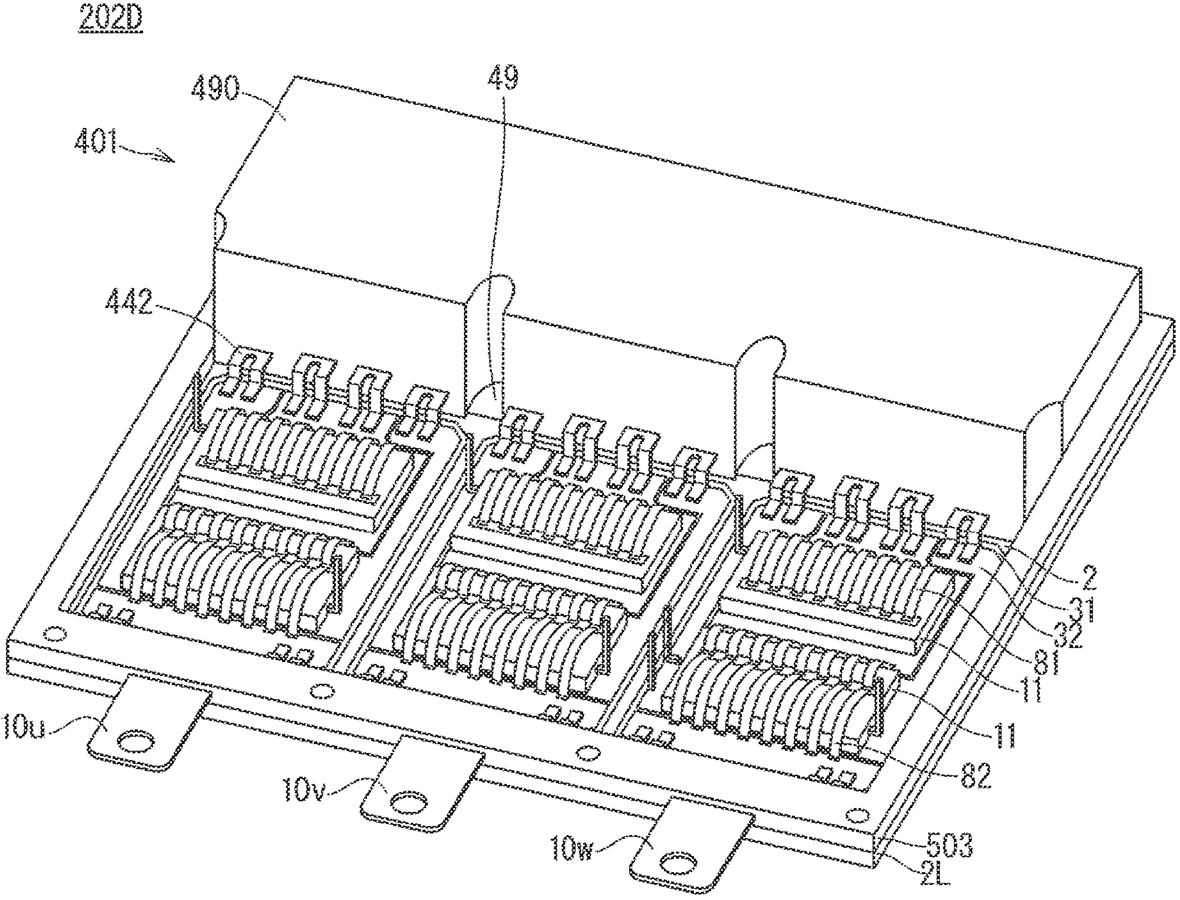
FIG. 22 is a perspective view schematically illustrating a configuration of a semiconductor device according to an embodiment 3.
Figure 23:
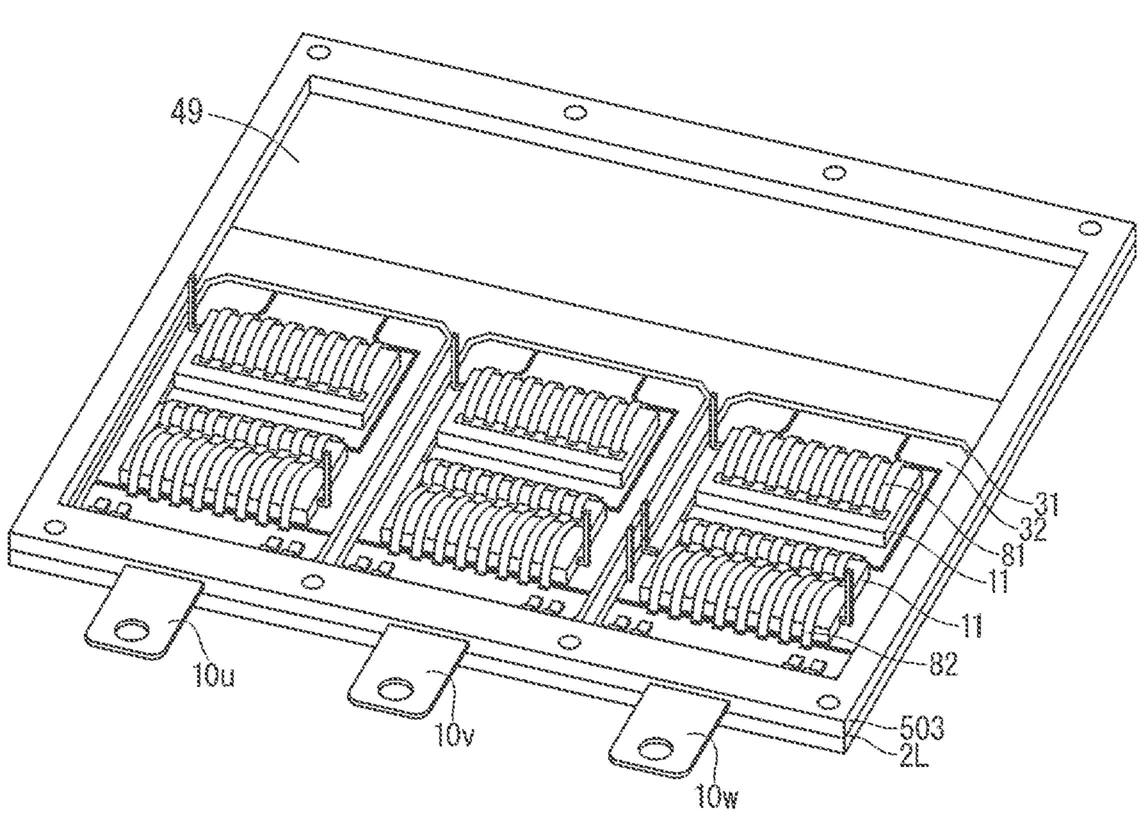
FIG. 23 is a perspective view schematically illustrating the configuration in FIG. 22 in which the illustration of the smoothing capacitor is omitted.
Figure 24:
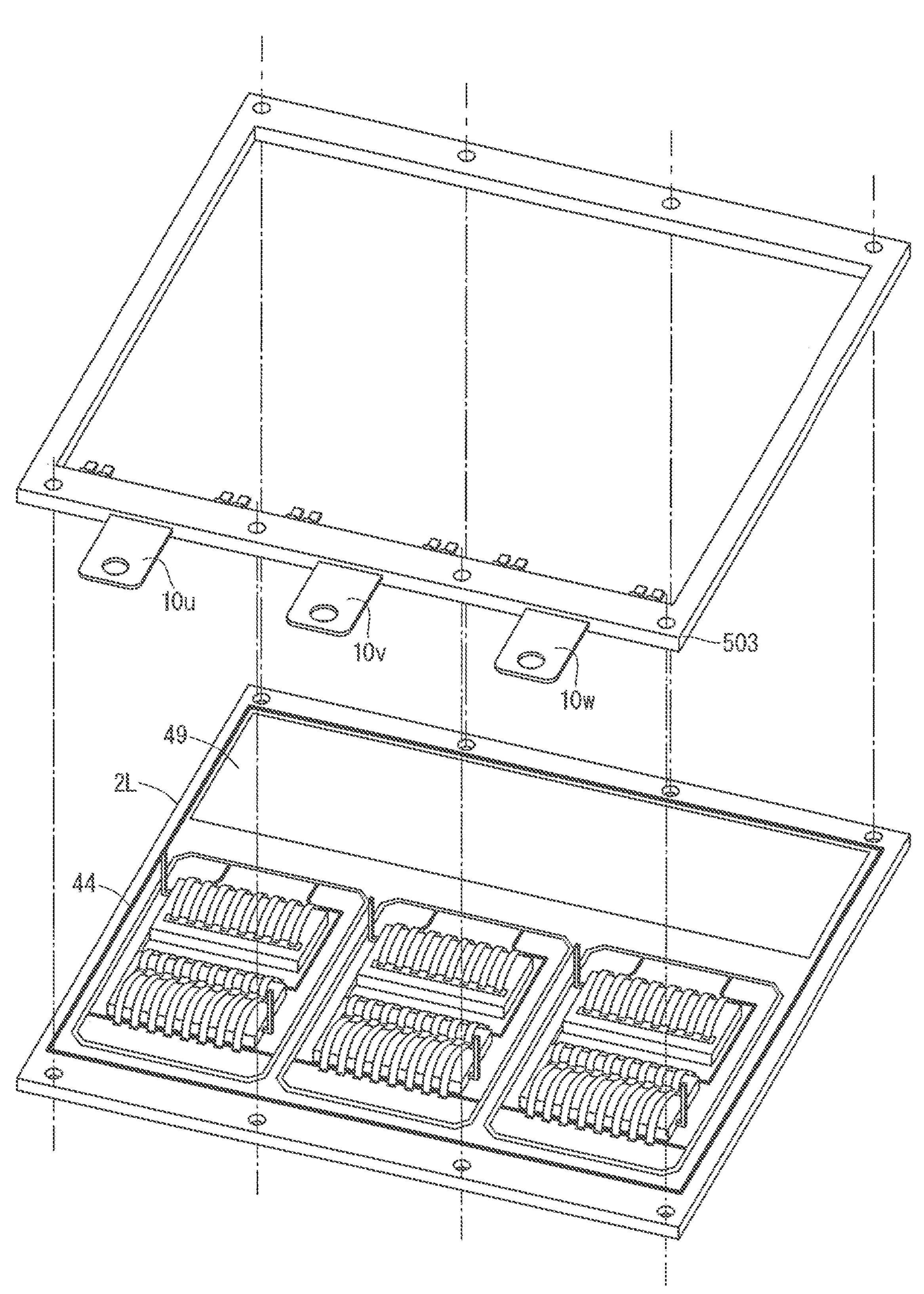
FIG. 24 is an exploded perspective view schematically illustrating the configuration in FIG. 23.

FIG. 22 is a perspective view schematically illustrating a configuration of a semiconductor device 202D according to an embodiment 3. FIG. 23 and FIG. 24 are a perspective view and an exploded perspective view each omitting illustration of the smoothing capacitor 401 and schematically illustrating the semiconductor device 202D. Illustration of the sealing portion 5 is omitted in FIG. 23 and FIG. 24 to see an inner part of the sealing portion 5 (refer to FIG. 4).

Applied in the present embodiment is a cooler 2L extending to be larger than the cooler 2 (FIG. 3: embodiment 1) to support not only the insulating substrate 31 but also the capacitor case 490 of the smoothing capacitor 401. Accordingly, the capacitor case 490 of the smoothing capacitor 401 is mounted on the cooler 2 via the thermal conductive member 49. Thus, the capacitor case 490 is thermally favorably connected to the cooler 2. The sealing member 44 and the substrate case 503 surround the insulating substrate 31 and the smoothing capacitor 401 on the cooler 2L.

A configuration other than that describe above is substantially the same as that according to the embodiment 1 described above; thus the repetitive description is omitted.

(Effect)

According to the present embodiment, the smoothing capacitor 401 can be integrally formed with the semiconductor device 202D with a relatively simple configuration. The smoothing capacitor 401 is supported by the cooler 2; thus robustness of the semiconductor device 202D is increased, and the semiconductor device 202D is easily handled.

The capacitor case 490 of the smoothing capacitor 401 is thermally favorably connected to the cooler 2; thus heat from the smoothing capacitor 401 occurring in discharge and charge can be efficiently radiated to the cooler 2 without a complex attention for a heat radiation path. Accordingly, the heat from the smoothing capacitor 401 causing increase of a temperature of the semiconductor element 1 can be suppressed. Thus, increase of operation loss or decrease of performance of the semiconductor element 1 due to increase of the temperature can be suppressed.

Modification Example of Embodiment 3

Figure 25:
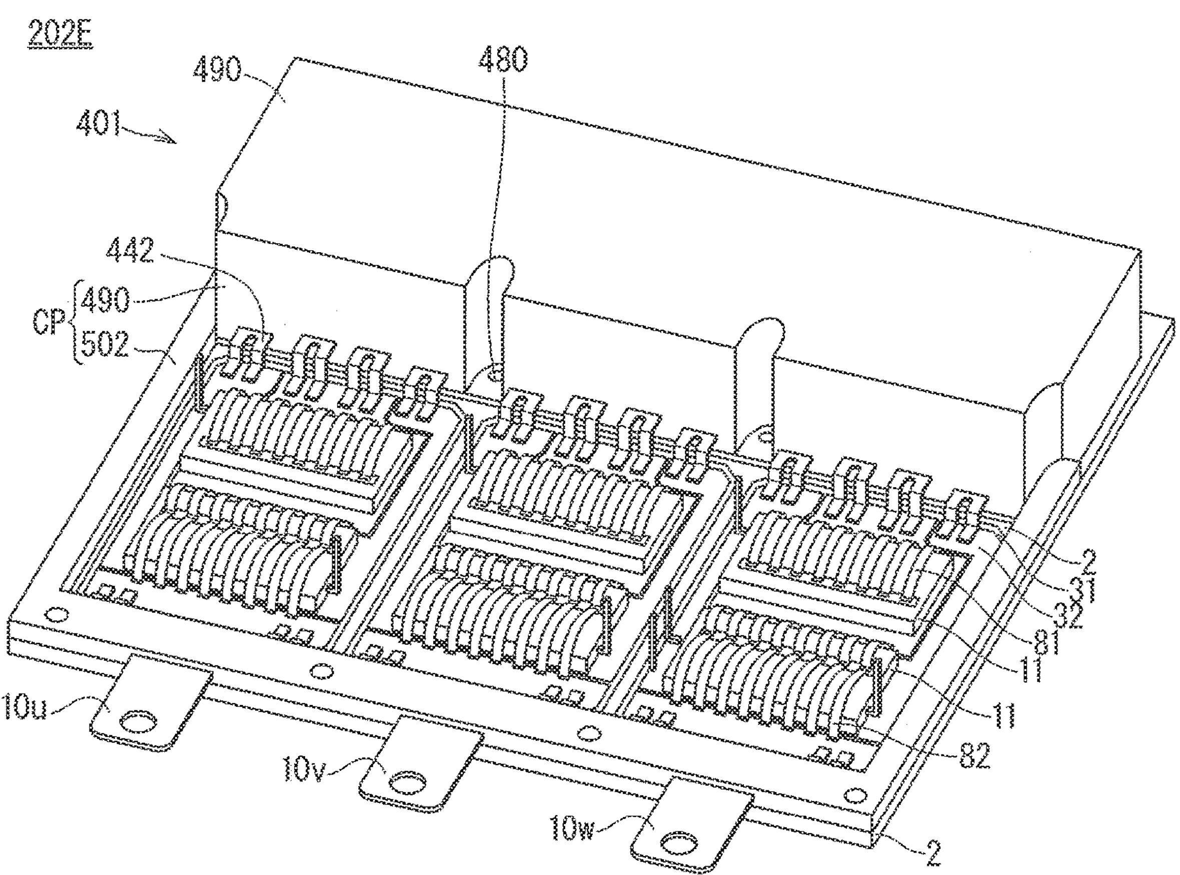
FIG. 25 is a perspective view schematically illustrating a configuration of a semiconductor device according to a modification example of the semiconductor device in FIG. 22.
Figure 26:
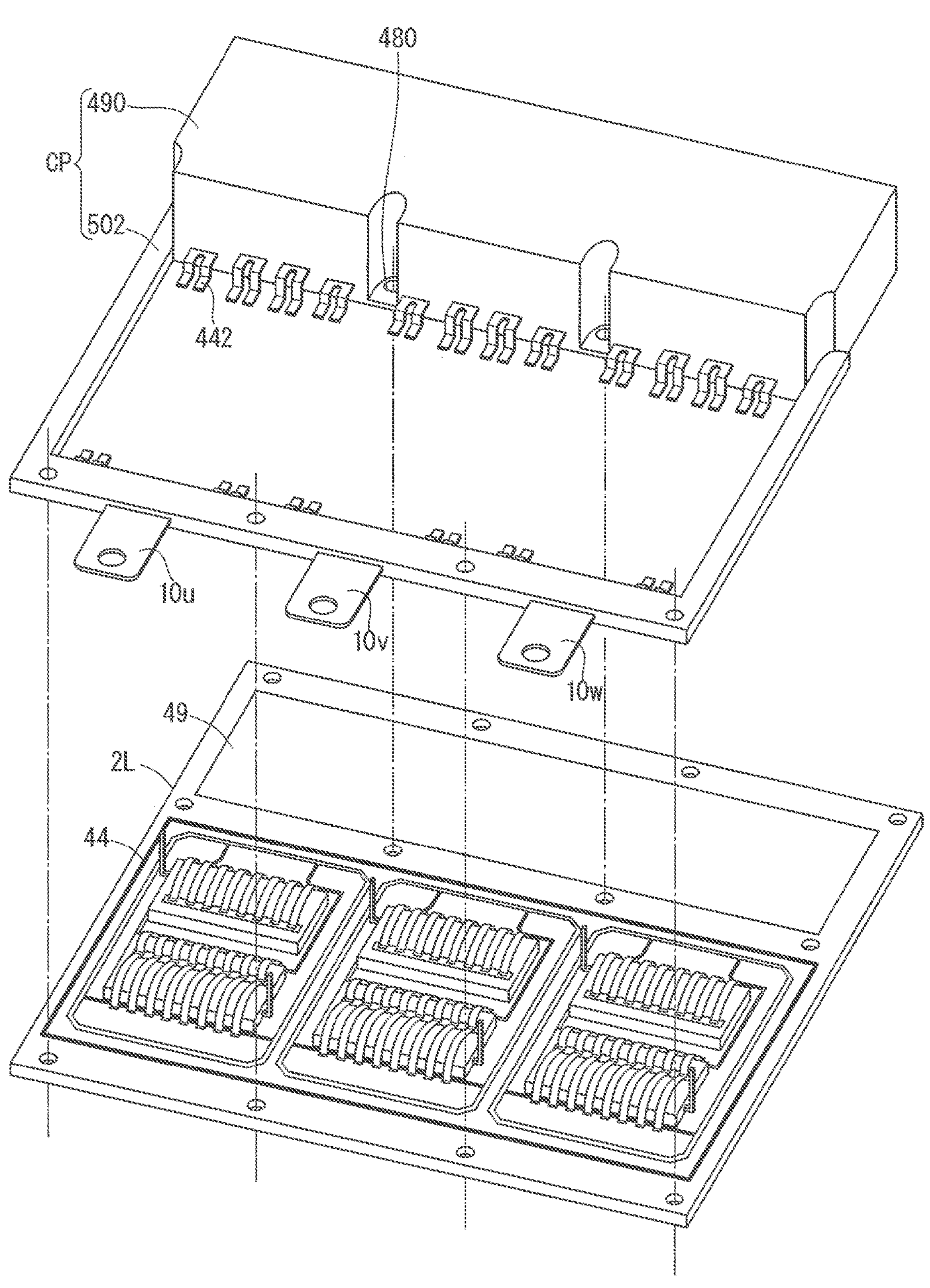
FIG. 26 is an exploded perspective view schematically illustrating the semiconductor device in FIG. 25.
Figure 27:
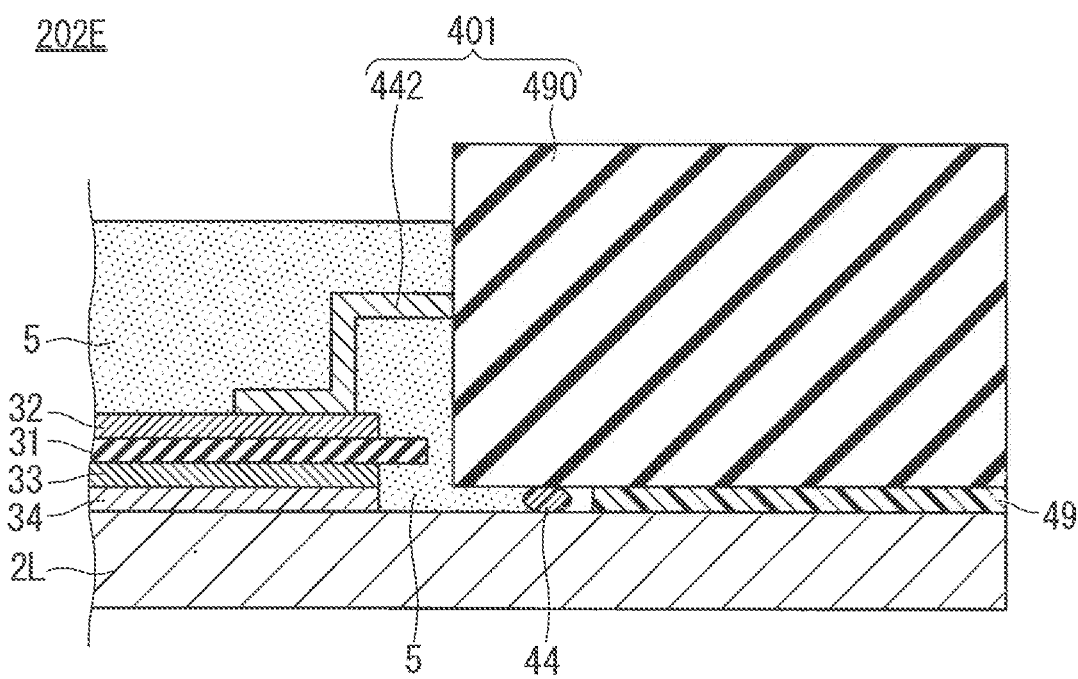
FIG. 27 is a partial cross-sectional view schematically illustrating the semiconductor device in FIG. 25.

FIG. 25, FIG. 26. and FIG. 27 are a perspective view, an exploded perspective view, and a partial cross-sectional view each schematically illustrating a configuration of a semiconductor device 202E according to the modification example of the semiconductor device 202D (FIG. 22). Illustration of the sealing portion 5 (FIG. 27) is omitted in FIG. 25 and FIG. 26.

The semiconductor device 202D according to the present modification example includes the substrate case 502 in the manner substantially similar to the semiconductor device 202C (FIG. 20 and FIG. 21: embodiment 2) described above. Specifically, the substrate case 502 is continuously formed with the capacitor case 490 of the smoothing capacitor 401 to constitute a case part CP together with the capacitor case 490 of the smoothing capacitor 401. Then inner side of the case part CP is filled with the sealing portion 5 (FIG. 27).

In the meanwhile, differing from the embodiment 2, the capacitor case 490 of the smoothing capacitor 401 is mounted on the cooler 2 via the thermal conductive member 49 in the semiconductor device 202E in the manner similar to the semiconductor device 202D (FIG. 22 to FIG. 24).

Each embodiment can be arbitrarily combined, or each embodiment can be appropriately varied or omitted.

<Appendix>

The aspects of the present disclosure are collectively described hereinafter as appendixes.

(Appendix 1)

A semiconductor device (202A to 202E), comprising:

a cooler (2);

an insulating substrate (31) mounted on the cooler (2);

a circuit pattern (32) provided on the insulating substrate (31);

a semiconductor element (1) electrically connected to the circuit pattern (32);

a smoothing capacitor (401) disposed not to be overlapped with the semiconductor element (1) in a plan view, the smoothing capacitor including an inner electrode (451) forming capacitance, a capacitor case (490) housing the inner electrode (451), and a terminal (442) protruding from the capacitor case (490) seamlessly; and a first sealing portion (5) covering at least a part of each of the terminal (442) of the smoothing capacitor (401), the insulating substrate (31), and the circuit pattern (32), wherein the terminal (442) of the smoothing capacitor (401) and the circuit pattern (32) are directly connected to each other by bonding force of an interface between the terminal (442) and the circuit pattern (32).

(Appendix 2)

The semiconductor device (202A to 202E) according to Appendix 1, wherein the first sealing portion (5) contains gel or rubber.

(Appendix 3)

The semiconductor device (202A to 202E) according to Appendix 1 or 2, wherein the semiconductor element (1) includes a first main surface and a second main surface, the semiconductor device (202A to 202E) further comprising:

a first conductor part (111) connected to the first main surface of the semiconductor element;

a second conductor part (112) connected to the second main surface of the semiconductor element; and a second sealing portion (130) covering a part of each of the first conductor part (111) and the second conductor part (112) while at least partially exposing each of the first conductor part (111) and the second conductor part (112), the second sealing portion sealing the semiconductor element (1), wherein the first main surface of the semiconductor element is electrically connected to the circuit pattern (32) via the first conductor part (111).

(Appendix 4)

The semiconductor device (202A, 202B) according to any one of Appendixes 1 to 3, further comprising:

a substrate case (501, 501M) including a first surface facing the cooler (2) and a second surface opposite to the first surface and extending to surround the insulating substrate (31) on the cooler (2) along a closed curve including a plurality of sides including a first side (SD1) and a second side (SD2); and a sealing member (44) provided between the second surface of the substrate case (501, 501M) and the smoothing capacitor (401) and made of a material having a lower degree of elasticity than each of a material of the substrate case (501, 501M) and a material of the capacitor case (490) of the smoothing capacitor (401), wherein the second surface of the substrate case (501, 501M) includes a first region (RG1) corresponding to the first side (SD1) and a second region (RG2) corresponding to the second side (SD2), the second region being lower than the first region (RG1), the smoothing capacitor (401) is attached on the second region (RG2) in the second surface via the sealing member (44), and the first sealing portion (5) fills an inner side of each of the substrate case (501, 501M) and the smoothing capacitor (401).

(Appendix 5)

The semiconductor device (202A, 202B) according to Appendix 4, wherein the sealing member (44) contains rubber.

(Appendix 6)

The semiconductor device (202B) according to Appendix 4, wherein the substrate case (501M) includes a first fitting part (FT1) provided to a part of the substrate case (501M) corresponding to the second side, the capacitor case (490) includes a second fitting part (FT2) with a groove (SL) into which the first fitting part (FT1) is inserted, and the sealing member (44) contains gel and fills a space between the first fitting part (FT1) and the second fitting part (FT2) in the groove (SL) of the second fitting part (FT2) in the capacitor case (490).

(Appendix 7)

The semiconductor device (200) according to any one of Appendixes 1 to 6, further comprising:

a fixing member (62); and a housing (7) attached to the cooler (2) using the fixing member (62), wherein the capacitor case (490) of the smoothing capacitor (401) includes a fixed part (480) for applying the fixing member (62), and the fixing member (62) fixes the fixed part (480) of the capacitor case (490) of the smoothing capacitor (401), the cooler (2), and the housing (7) to each other.

(Appendix 8)

The semiconductor device (202C) according to any one of Appendixes 1 to 3, further comprising:

a substrate case (502) continuously formed with the capacitor case (490) of the smoothing capacitor (401) to constitute a case part (CP) together with the capacitor case (490) of the smoothing capacitor (401), wherein the case part (CP) surrounds the insulating substrate (31) on the cooler (2), and the first sealing portion (5) fills an inner side of the case part (CP); and a sealing member (44) between the case part (CP) and the cooler (2), made of a material which can be formed at a lower temperature than a heat resisting temperature of the smoothing capacitor (401).

(Appendix 9)

The semiconductor device (202D, 202E) according to any one of Appendixes 1 to 3, wherein the capacitor case (490) of the smoothing capacitor (401) is mounted on the cooler via a thermal conductive member (49).

(Appendix 10)

The semiconductor device (202A to 202E) according to any one of Appendixes 1 to 9, wherein the terminal (442) of the smoothing capacitor includes:

a root part (RT) extending from the capacitor case (490) of the smoothing capacitor (401) to be away from the circuit pattern (32); and a plurality of connection parts (CN) extending from the root part (RT) to be directly connected to the circuit pattern (32), and the plurality of connection parts (CN) are separated from each other.

(Appendix 11)

The semiconductor device (202A to 202E) according to any one of Appendixes 1 to 10, wherein the semiconductor element (1) is a wide bandgap semiconductor element.

(Appendix 12)

A power conversion device (200), comprising:

a main conversion circuit (201) including the semiconductor device (202A to 202E) according to any one of Appendixes 1 to 11, the main conversion circuit converting and outputting electrical power which has been inputted to the main conversion circuit; and a control circuit (203) outputting a control signal controlling the main conversion circuit to the main conversion circuit.

(Appendix 13)

A method of manufacturing a semiconductor device for manufacturing the semiconductor device (202B) according to Appendix 6, comprising:

forming the sealing member (44) containing gel; and forming the first sealing portion (5) containing gel after forming the sealing member (44).

(Appendix 14)

A method of manufacturing a semiconductor device for manufacturing the semiconductor device (202A, 202B) according to any one of Appendixes 1 to 6, comprising:

a) fixing a fixed part (480) included in the capacitor case (490) of the smoothing capacitor (401) to the cooler (2); and b) bonding the terminal (442) of the smoothing capacitor (401) to the circuit pattern (32) after the a).

(Appendix 15)

The method of manufacturing the semiconductor device according to Appendix 14, wherein the a) is performed by applying a first fixing member (61) to the fixed part (480) of the capacitor case (490) of the smoothing capacitor (401), and the method of manufacturing the semiconductor device further comprising:

c) mounting the cooler (2) to a housing (7);

d) detaching the first fixing member (61) after the c); and e) fixing the fixed part (480) of the capacitor case (490) of the smoothing capacitor (401), the cooler (2), and the housing (7) to each other by applying a second fixing member (62) to the fixed part (480) of the capacitor case (490) of the smoothing capacitor (401).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a cooler;

an insulating substrate mounted on the cooler;

a circuit pattern provided on the insulating substrate;

a semiconductor element electrically connected to the circuit pattern;

a smoothing capacitor disposed not to be overlapped with the semiconductor element in a plan view, the smoothing capacitor including an inner electrode forming capacitance, a capacitor case housing the inner electrode, and a terminal protruding from the capacitor case seamlessly; and a first sealing portion covering at least a part of each of the terminal of the smoothing capacitor, the insulating substrate, and the circuit pattern, wherein the terminal of the smoothing capacitor and the circuit pattern are directly connected to each other by bonding force of an interface between the terminal and the circuit pattern.

2. The semiconductor device according to claim 1, wherein the first sealing portion contains gel or rubber.

3. The semiconductor device according to claim 1, wherein the semiconductor element includes a first main surface and a second main surface, the semiconductor device further comprising:

a first conductor part connected to the first main surface of the semiconductor element;

a second conductor part connected to the second main surface of the semiconductor element; and a second sealing portion covering a part of each of the first conductor part and the second conductor part while at least partially exposing each of the first conductor part and the second conductor part, the second sealing portion sealing the semiconductor element, wherein the first main surface of the semiconductor element is electrically connected to the circuit pattern via the first conductor part.

4. The semiconductor device according to claim 1, further comprising:

a substrate case including a first surface facing the cooler and a second surface opposite to the first surface and extending to surround the insulating substrate on the cooler along a closed curve including a plurality of sides including a first side and a second side; and a sealing member provided between the second surface of the substrate case and the smoothing capacitor and made of a material having a lower degree of elasticity than each of a material of the substrate case and a material of the capacitor case of the smoothing capacitor, wherein the second surface of the substrate case includes a first region corresponding to the first side and a second region corresponding to the second side, the second region being lower than the first region, the smoothing capacitor is attached on the second region in the second surface via the sealing member, and the first sealing portion fills an inner side of each of the substrate case and the smoothing capacitor.

5. The semiconductor device according to claim 4, wherein the sealing member contains rubber.

6. The semiconductor device according to claim 4, wherein the substrate case includes a first fitting part provided to a part of the substrate case corresponding to the second side, the capacitor case includes a second fitting part with a groove into which the first fitting part is inserted, and the sealing member contains gel and fills a space between the first fitting part and the second fitting part in the groove of the second fitting part in the capacitor case.

7. A method of manufacturing a semiconductor device for manufacturing the semiconductor device according to claim 6, comprising:

forming the sealing member containing gel; and forming the first sealing portion containing gel after forming the sealing member.

8. The semiconductor device according to claim 1, further comprising:

a fixing member; and a housing attached to the cooler using the fixing member, wherein the capacitor case of the smoothing capacitor includes a fixed part for applying the fixing member, and the fixing member fixes the fixed part of the capacitor case of the smoothing capacitor, the cooler, and the housing to each other.

9. The semiconductor device according to claim 1, further comprising:

a substrate case continuously formed with the capacitor case of the smoothing capacitor to constitute a case part together with the capacitor case of the smoothing capacitor, wherein the case part surrounds the insulating substrate on the cooler, and the first sealing portion fills an inner side of the case part; and a sealing member between the case part and the cooler, made of a material which can be formed at a lower temperature than a heat resisting temperature of the smoothing capacitor.

10. The semiconductor device according to claim 1, wherein the capacitor case of the smoothing capacitor is mounted on the cooler via a thermal conductive member.

11. The semiconductor device according to claim 1, wherein the terminal of the smoothing capacitor includes:

a root part extending from the capacitor case of the smoothing capacitor to be away from the circuit pattern; and a plurality of connection parts extending from the root part to be directly connected to the circuit pattern, and the plurality of connection parts are separated from each other.

12. The semiconductor device according to claim 1, wherein the semiconductor element is a wide bandgap semiconductor element.

13. A power conversion device, comprising:

a main conversion circuit including the semiconductor device according to claim 1, the main conversion circuit converting and outputting electrical power which has been inputted to the main conversion circuit; and a control circuit outputting a control signal controlling the main conversion circuit to the main conversion circuit.

14. A method of manufacturing a semiconductor device for manufacturing the semiconductor device according to claim 1, comprising:

a) fixing a fixed part included in the capacitor case of the smoothing capacitor to the cooler; and b) bonding the terminal of the smoothing capacitor to the circuit pattern after the a).

15. The method of manufacturing the semiconductor device according to claim 14, wherein the a) is performed by applying a first fixing member to the fixed part of the capacitor case of the smoothing capacitor, and the method of manufacturing the semiconductor device further comprising:

c) mounting the cooler to a housing;

d) detaching the first fixing member after the c); and e) fixing the fixed part of the capacitor case of the smoothing capacitor, the cooler, and the housing to each other by applying a second fixing member to the fixed part of the capacitor case of the smoothing capacitor.

* * * * *